United States Patent
Jung et al.

(10) Patent No.: US 10,101,408 B2
(45) Date of Patent: Oct. 16, 2018

(54) WIRELESS POSITION SENSING USING MAGNETIC FIELD OF SINGLE TRANSMITTER

(71) Applicant: Purdue Research Foundation, West Lafayette, IN (US)

(72) Inventors: Byunghoo Jung, West Lafayette, IN (US); Mohit Singh, West Lafayette, IN (US)

(73) Assignee: PURDUE RESEARCH FOUNDATION, West Lafayette, IN (US)

(*) Notice: Subject to any disclaimer, the term of this patent is extended or adjusted under 35 U.S.C. 154(b) by 524 days.

(21) Appl. No.: 14/697,008

(22) Filed: Apr. 27, 2015

(65) Prior Publication Data

US 2015/0309126 A1    Oct. 29, 2015

Related U.S. Application Data

(60) Provisional application No. 61/984,242, filed on Apr. 25, 2014.

(51) Int. Cl.
*G01R 33/02* (2006.01)
*G01D 5/20* (2006.01)
*G01C 21/20* (2006.01)

(52) U.S. Cl.
CPC ......... *G01R 33/0206* (2013.01); *G01C 21/20* (2013.01); *G01D 5/2073* (2013.01); *G01C 21/206* (2013.01)

(58) Field of Classification Search
CPC . G01V 3/28; G01V 3/38; G01V 3/165; A63B 2225/50; G01C 21/20; G01C 21/206

(Continued)

(56) References Cited

U.S. PATENT DOCUMENTS

2010/0070219 A1* 3/2010 Azancot ............... H02J 5/005
                                              702/62
2010/0141261 A1* 6/2010 Overby ................. G01V 3/12
                                              324/329

(Continued)

OTHER PUBLICATIONS

Loke, et al., Magnetic Tracking System for Radiation Therapy. Biomedical Circuits and Systems, IEEE Transactions on, 2010, vol. 4, Issue 4, 223-231.

*Primary Examiner* — Roy Y Yi
*Assistant Examiner* — Jeffrey Aiello
(74) *Attorney, Agent, or Firm* — Purdue Research Foundation

(57) ABSTRACT

A positioning system for determining the location of a receiver relative to a transmitter. The system includes a transmitting coil having a known orientation with respect to the earth's coordinate system and configured to transmit a periodic signal during a positioning event, at least one receiver including a sensing unit for measuring the magnetic field vector produced by the transmitting coil and the orientation of the receiver with respect to the earth's coordinate system, and at least one computing unit configured to estimate a position and orientation of the receiver with respect to the transmitter's coordinate system using the measured magnetic field vector, the measured orientation with respect to the earth's coordinate system, and the known orientation of the transmitting coil with respect to the earth's coordinate system.

18 Claims, 22 Drawing Sheets

(58) Field of Classification Search
USPC .................................... 307/104; 702/62, 150
See application file for complete search history.

(56) References Cited

U.S. PATENT DOCUMENTS

| | | | |
|---|---|---|---|
| 2011/0181290 A1* | 7/2011 | Kuzmin | G01V 3/17 324/331 |
| 2012/0283952 A1* | 11/2012 | Tang | E21B 47/02216 702/7 |
| 2012/0319686 A1* | 12/2012 | Jesmanowicz | A61B 5/055 324/309 |
| 2013/0166002 A1 | 6/2013 | Jung et al. | |
| 2015/0227127 A1* | 8/2015 | Miller | G05B 19/042 700/244 |
| 2016/0356601 A1* | 12/2016 | Lescourret | F41G 3/225 |
| 2017/0116496 A1* | 4/2017 | Fung | G06K 9/2054 |

\* cited by examiner

WIRELESS POSITION SENSING USING MAGNETIC FIELD OF SINGLE TRANSMITTER

RELATED APPLICATIONS

The present application claims the benefit of U.S. provisional application Ser. No. 61/984,242, filed Apr. 25, 2014, the contents of which are hereby incorporated by reference in its entirety.

TECHNICAL FIELD

The present application relates to wirelessly detecting positions of devices, e.g., portable or mobile devices.

BACKGROUND

There is an increasing need for ways of determining the location of mobile or portable objects or devices, e.g., cellular telephones or blood-borne sensors. GPS, LORAN, and similar systems can provide location information, but often only with resolution on the order of 15 m. Moreover, such systems can be more difficult to use indoors due to changes in signal propagation through walls and other features of buildings. WIFI or BLUETOOTH triangulation has been proposed and may have an accuracy as low as 1-2 m indoors. However, these schemes often require large databases of known transmitters (TX). There is, therefore, a need of positioning systems that provide high accuracy and do not require large databases.

Reference is made to US 2013/0166002 by Jung et al., published Jun. 27, 2013, the disclosure of which is incorporated herein by reference.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

Figure 1A:
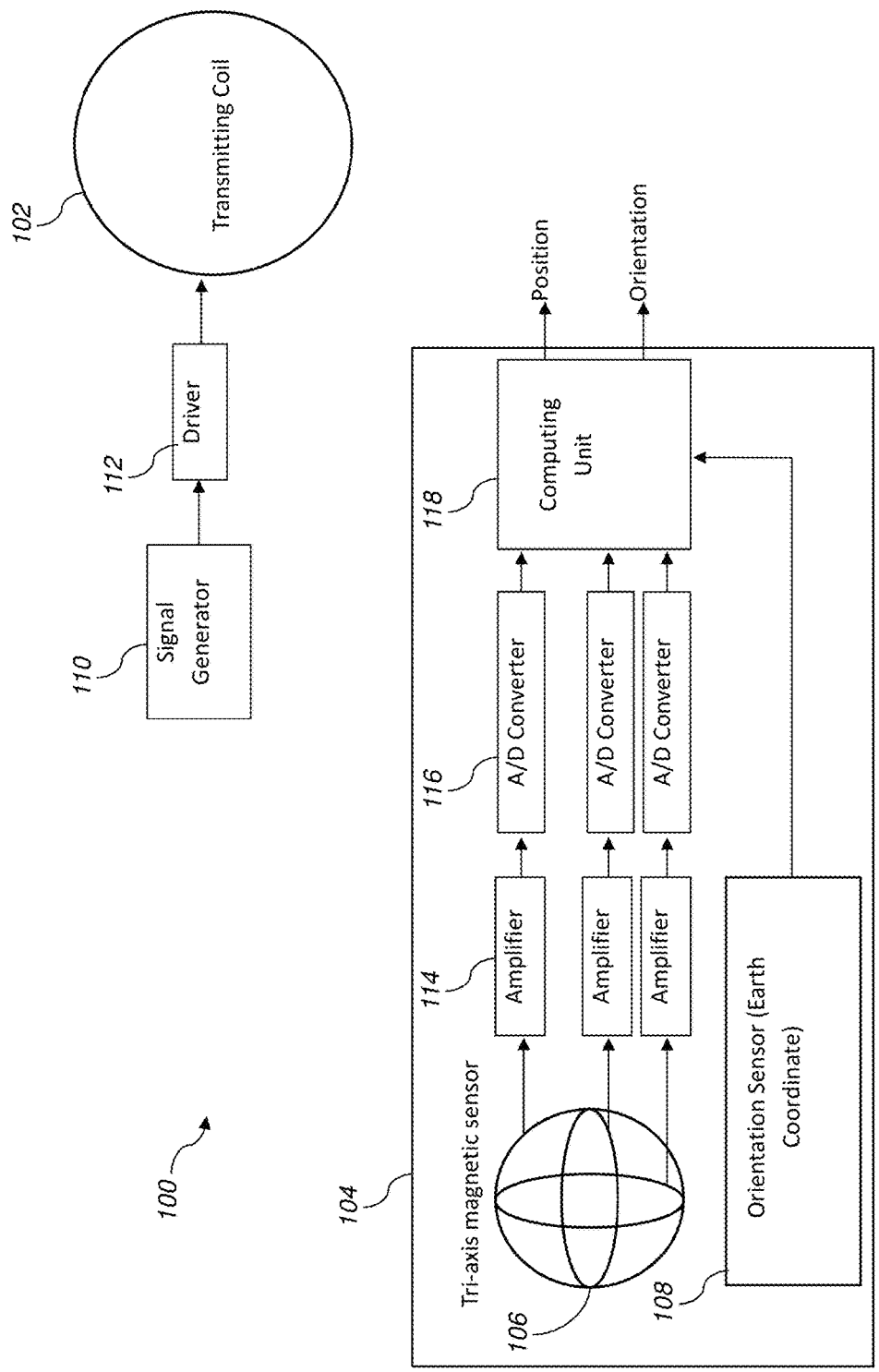
FIG. 1A is a simplified block diagram of a positioning system according to one embodiment.

The attached drawings are for purposes of illustration and are not necessarily to scale.

DETAILED DESCRIPTION

In the following description, some aspects will be described in terms that would ordinarily be implemented as software programs. Those skilled in the art will readily recognize that the equivalent of such software can also be constructed in hardware, firmware, or micro-code. Because data-manipulation algorithms and systems are well known, the present description will be directed in particular to algorithms and systems forming part of, or cooperating more directly with, systems and methods described herein. Other aspects of such algorithms and systems, and hardware or software for producing and otherwise processing the signals involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Various aspects herein advantageously permit position to be determined rapidly using a low-power microcontroller. No large database of hotspots or antennas is required. Various aspects permit very high-speed tracking of motion.

Throughout this disclosure, the term "coil" when used in reference to an antenna is not limiting, and other types of antennas capable of performing the listed functions can be used. Various aspects herein use low frequencies, e.g., <1 MHz or <500 kHz, ~70 kHz, or ~80 kHz or ~35 kHz. Other frequencies can also be used, e.g., >1 MHz. Magnetic sensors described herein can include sensors including two or more substantially orthogonal coils for measuring components of a magnetic field. A triaxial or other magnetoresistive sensor can also or alternatively be used.

Throughout this disclosure, references to the Earth's coordinate system include other reference coordinate systems common or substantially common to transmitter and receiver.

In one embodiment, the earth-coordinate orientation is used to rotate the measured magnetic field from uvw to xyz coordinates, and then the magnetic field is tested for intensity and direction to determine where (what position) in the transmitter's near field that magnetic field intensity and direction would occur. That determined position is substantially equal to the position of the receiver (RX).

In view of the foregoing, various aspects providing determination of the location of a receiver in proximity to a wireless transmitter are disclosed. A technical effect is to detect magnetic fields from the transmitter(s) and determine the location of the receiver using the detected fields. Further technical effects of various aspects include presenting an indication of the receiver's position on an electronic display and transmitting the determined position to the transmitter, a computer or computing unit, or another device.

FIG. 1A illustrates a basic block diagram of a positioning system 100 according to one embodiment. As shown, the positioning system 100 includes a transmitter (shown as antenna coil 102) and at least one receiver 104. The receiver 104 includes a tri-axis magnetic sensor 106 and an orientation sensor 108. The coil 102 can have any two-dimensional and three-dimensional shape: circular, elliptic, rectangle, square, diamond, triangle, etc. Signal generator 110 and driver 112 may be included to generate a waveform and drive the coil 102 to transmit a periodic beacon signal which has a fixed frequency. Any periodic signal can be used, but a sinusoidal signal is preferred as it is most effective for simplifying the transmitter and receiver design. The transmitting coil 102 will generate a spatial magnetic field where the field strength and direction depends on the position in the space. Amplifiers 112, A/D converter 116 may be operatively connected as shown to amplify and convert the output of the magnetic sensor 106 to a digital form suitable for input by a computing unit 118. The computing unit 118 may further receive the output of the orientation sensor 108.

Figure 1B:
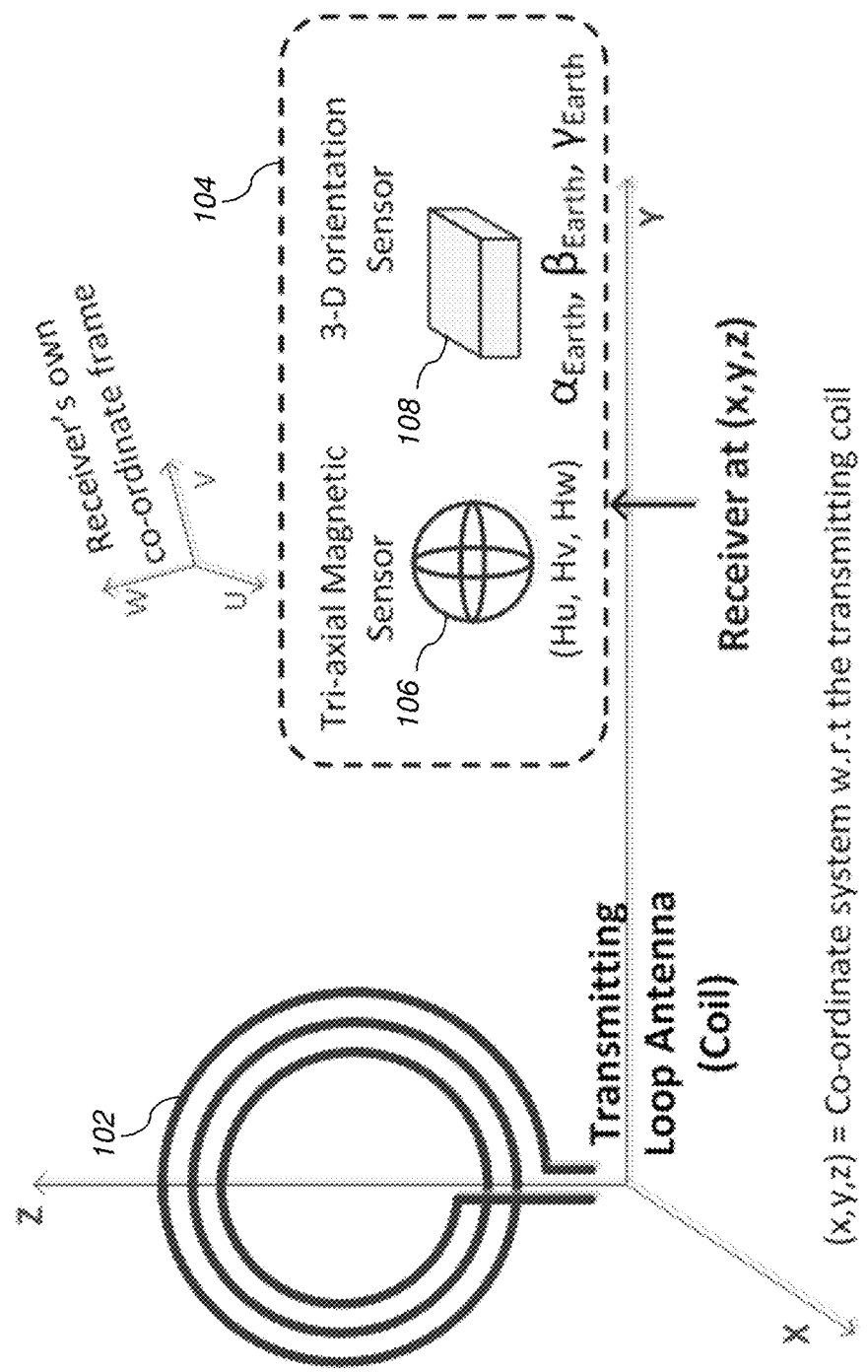
FIG. 1B is a block diagram showing the system of FIG. 1A in a 3-dimensional environment.
Figure 2:
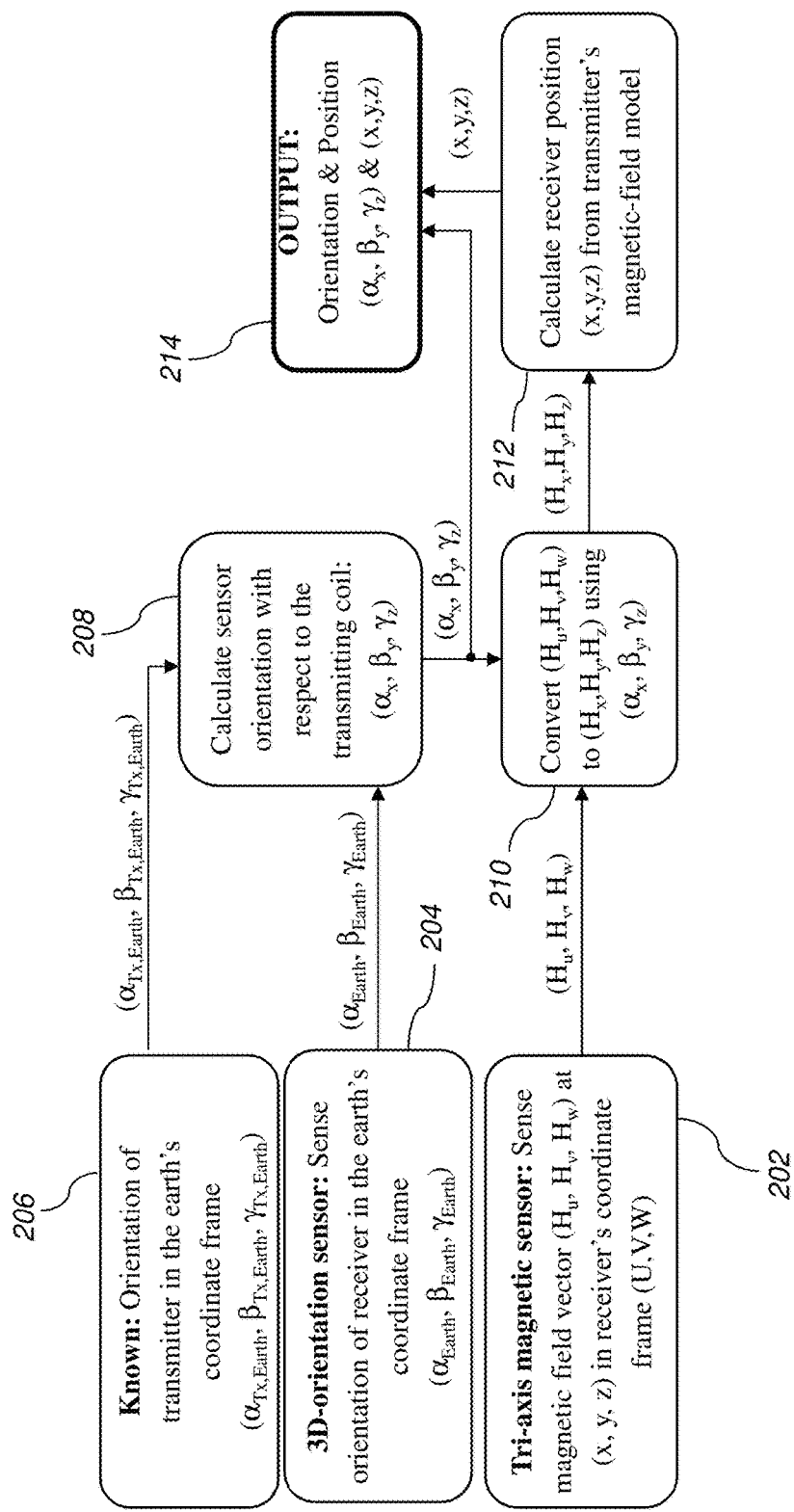
FIG. 2 is a simplified block diagram of a positioning process according to one embodiment.

FIG. 1B illustrates operation of the system 110 in a 3-dimensional environment. FIG. 2 further illustrates the steps involved in determining the position and orientation of the receiver 104 relative to the coil 102. The tri-axis magnetic sensor 106 in the receiver 104 measures (block 202) a magnetic field $(H_u, H_v, H_w)$ at the receiver 104 position (x, y, z) generated by the transmitting coil 102 in the receiver's own coordinate frame (U, V, W). The three dimensional orientation sensor 108 measures (block 204) its orientation in the earth's coordinate frame $(\alpha_{Earth}, \beta_{Earth}, \gamma_{Earth})$. The measured data $(H_u, H_v, H_w)$ and $(\alpha_{Earth}, \beta_{Earth}, \gamma_{Earth})$ are provided to the computing unit 118. The computing unit 118 may be placed in the receiver, in the transmitter, or somewhere else. When the computing unit 118 is not placed in the receiver 104, the measured data may be sent to a remote computing unit placed outside of the receiver 104 through a wireless channel or wired channel. The orientation of the transmitting coil 102 in the earth's coordinate frame $(\alpha_{Tx,Earth}, \beta_{Tx,Earth}, \gamma_{Tx,Earth})$ is provided (block 206) to the computing unit 118. The orientation of the transmitting coil 102 in the earth's coordinate frame $(\alpha_{Tx,Earth}, \beta_{Tx,Earth}, \gamma_{Tx,Earth})$ can also be provided to a remote computing unit through a wireless channel or wired channel. Also, for fixed coil installations, the known value of the orientation of the transmitting coil 102 in the earth's coordinate frame $(\alpha_{Tx,Earth}, \beta_{Tx,Earth}, \gamma_{Tx,Earth})$ can be stored in the computing unit 118, and the stored value can be used in the following computation.

The computing unit 118 estimates (block 208) the receiver 104 orientation $(\alpha_x, \beta_y, \gamma_z)$ with respect to the transmitting coil 102 from the orientation sensor data $(\alpha_{Earth}, \beta_{Earth}, \gamma_{Earth})$ and the known coil orientation data $(\alpha_{Tx,Earth}, \beta_{Tx,Earth}, \gamma_{Tx,Earth})$. After that, the measured magnetic field vector $(H_u, H_v, H_w)$ can be rotated (block 210) using the estimated orientation with respect to the transmitting coil $(\alpha_x, \beta_y, \gamma_z)$ to align it to the transmitting coil's coordinate frame (X, Y, Z). The operation will result in the magnetic field vector $(H_x, H_y, H_z)$ at the receiver position (x, y, z) generated by the transmitting coil in transmitting coil's coordinate frame (X, Y, Z). Because we can estimate the expected magnetic field vector $(H_x, H_y, H_z)$ at any position (x, y, z) generated by the transmitting coil using a physical modeling, we can estimate the position of the receiver (x, y, z) utilizing the estimated magnetic field vector $(H_x, H_y, H_z)$(block 212). The orientation and position of the receiver 104 relative to the transmitting coil 102 is them output by the computing unit 118 (block 214).

Indoor RF transmission modalities can be heavily affected by channel characteristics, e.g., the structure of buildings. In various embodiments, frequencies <1 MHz are used for effective propagation through, e.g., walls, human bodies, and other features of indoor environments. Such frequencies have wavelengths in the tens of meters, so the receivers can operate in the near field of the transmitting antenna, and not in the far field. Therefore radiative effects do not need to be considered or compensated for, in various examples. Lower frequencies increase the antenna size and provide improved penetration of objects. In various embodiments using frequencies of 12 MHz or higher, position accuracy can be more affected by walls than at lower frequencies. However, frequencies of 12 MHz and above can be used, and advantageously still pass through human bodies.

In the disclosed embodiments, various low frequencies can be used since the electromagnetic spectrum is not heavily used at LF. Other users include ham radio operators. Multiple frequencies can be used for different transmitters, and receivers can include notch filters corresponding to specific transmitter frequencies to avoid interference.

Various orientation sensors 108 can be used, e.g., a solid state compass and accelerometer device. The Earth's orientation is used as a reference for the rotation from xyz into uvw. A tri-axis magnetic sensor can be used to detect both the Earth's magnetic field (a DC field) and the TX field (an AC field), or separate sensors can be used.

Throughout this disclosure, once a position or orientation of the receiver is determined with respect to the transmitter, that position or orientation can be transformed into other coordinate systems, e.g., Earth-relative systems such as WGS84 or local systems such as a coordinate frame of a room or building. Coordinate transforms can be done using rotations, skews, and other techniques well known in the computer-graphics and cartographic arts.

Figure 3:
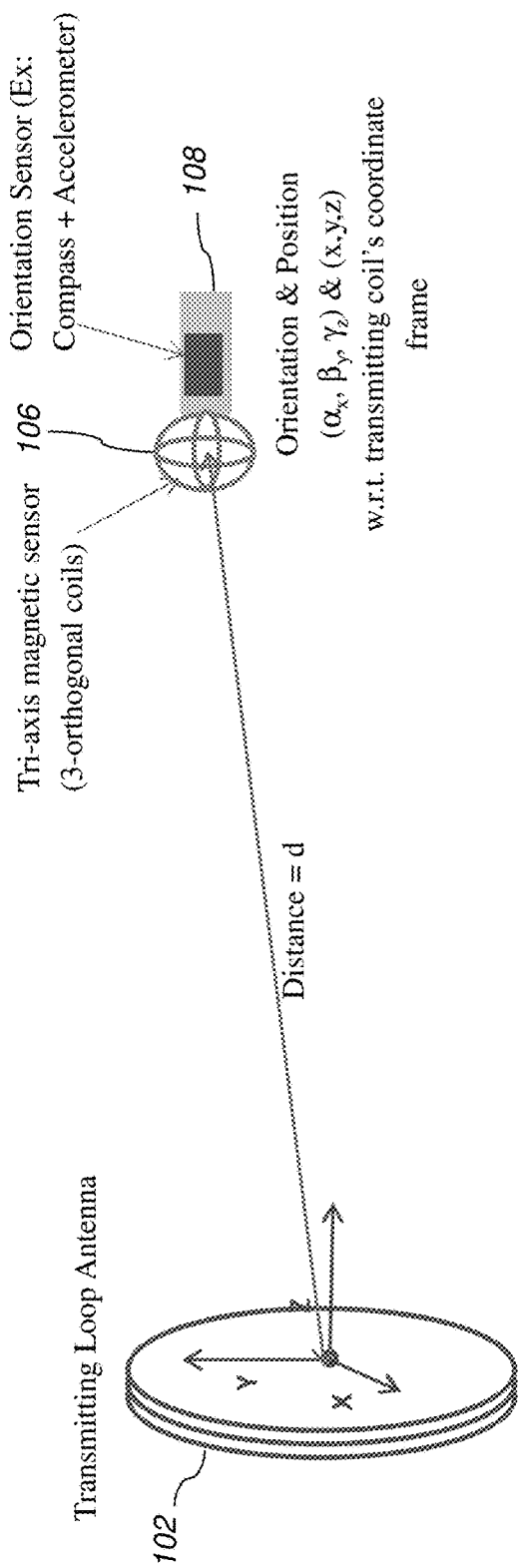
FIG. 3 is a diagram showing an example experimental setup of the system of FIG. 1A.

FIG. 3 illustrates an example implementation of the system 100 for finding location and orientation of the receiver 104 using the transmitter coil 102. In the example of FIG. 3, the transmitting signal frequency used is 750 kHz, the coil 102 used has 28 turns, and a coil diameter of 22 cm, with a signal amplitude of 10V peak-to-peak. A distributed magnetic field model may be used to estimate the spatial magnetic field distribution generated by the transmitting coil 102 and to track the receiver 104 in this example. A distributed magnetic field model is used, instead of using an equation based magnetic field model, because equation based models tend to provide inaccurate magnetic field especially in the areas close to the transmitting coil. Use of this distributed model improves the tracking accuracy significantly. The method we used to apply the distributed model is described as follows. First, each turn of coil 102 is segmented into multiple pieces (30 segments are used in this example) and the resultant field vector at the point of observation is calculated by adding the field vectors produced by the 30 segments. The same is repeated for all turns of the coil 102. Alternatively, instead of following the process of breaking each turn in the coil 102 into segments and applying Biot-Savart Law to all the segments in each turn, we can calculate the magnetic field due to a single turn and multiply it with the number of turns in the coil 102 to get the total magnetic field. This is like assuming the coil wire to be infinitesimally thin.

A solid-state compass-cum-accelerometer is used as the orientation sensor 108 at the receiver 104 is used to measure the receiver 104 orientation ($\alpha_{Earth}$, $\beta_{Earth}$, $\gamma_{Earth}$) with respect to the earth's coordinate frame. In this example, the orientation sensor 108 has an output rate of 220 Hz, an earth field magnetic resolution of 5 miligauss, and linear acceleration sensitivity of 4 mg/digit. The method used to get the receiver orientation ($\alpha_{Earth}$, $\beta_{Earth}$, $\gamma_{Earth}$) using the measured solid-state compass and accelerometer outputs is described is as follows. The 3-axis accelerometer provides the pitch and roll angles of the receiver while the compass provides the yaw of the receiver. The formula used is:

$$\text{Pitch} = \sin^{-1}\left(\frac{-A_x}{\sqrt{A_x^2 + A_y^2 + A_z^2}}\right) \quad (1)$$

$$\text{Roll} = \sin^{-1}\left(\frac{A_y}{\cos(\text{pitch})}\right) \quad (2)$$

$$\text{Yaw} = \quad (3)$$
$$\tan^{-1}\left(\frac{M_x\sin(\text{roll})\sin(\text{pitch}) + M_y\cos(\text{roll}) - M_z\sin(\text{roll})\cos(\text{pitch})}{M_x\cos(\text{pitch}) + M_z\sin(\text{pitch})}\right)$$

Where,
$A_x$=acceleration in +x direction
$A_y$=acceleration in +y direction
$A_z$=acceleration in +z direction
$M_x$=Magnetic field in +x direction
$M_y$=Magnetic field in +y direction
$M_z$=Magnetic field in +z direction The orientation sensor 108 in this example uses the North, East, Down, (commonly referred to as NED) angle convention, to define the ground reference frame which is used in many aerospace applications. The computing unit 118 receives the data from the orientation sensor and applies the above formula to calculate the orientation of the receiver 104 relative to the earth. In this example, (yaw, pitch, roll) angle convention is used instead of classic Euler angles, which can be easily transformed into each other.

Next, the measured receiver 104 orientation ($\alpha_{Earth}$, $\beta_{Earth}$, $\gamma_{Earth}$) in the earth's coordinate frame is converted into the receiver 104 orientation ($\alpha_x$, $\beta_y$, $\gamma_z$) in the transmitter coil 102 coordinate frame (X,Y,Z) using the known orientation of the transmitting coil 102 ($\alpha_{Tx,Earth}$, $\beta_{Tx,Earth}$, $\gamma_{Tx,Earth}$) in the earth's coordinate frame. In this example, the transmitter coil is standing upright. This ensures that $\beta_{Tx,Earth}=0$ and $\gamma_{Tx,Earth}=0$. Thus, $$\alpha_x = \alpha_{Earth} - \alpha_{TxEarth}, \text{ for } \beta_{TxEarth}=0 \text{ and } \gamma_{TxEarth}=0 \quad (4)$$

Coordinate transformation can then be used to find the correct angles in cases where $\beta_{Tx,Earth} \neq 0$ or $\gamma_{Tx,Earth} \neq 0$.

In the example embodiment, a tri-axis coil, with three orthogonally placed planar coils, is used as the magnetic field sensor 106 that measures the magnetic field vector produced by the transmitting coil 102. A solid-state tri-axis magnetic sensor (for example Honeywell HMC1043) can be also used. The tri-axis magnetic sensor 106 in the receiver 104 measures the magnetic field vector ($H_u,H_v,H_w$) at the receiver 104 position in the sensor 106 (receiver's) own coordinate frame (U,V,W). The measured magnetic field vector ($H_u,H_v,H_w$) in the receiver's 104 own coordinate frame (U,V,W) is converted into a magnetic field vector ($H_x,H_y,H_z$) in the transmitter's coordinate frame (X,Y,Z) using the receiver 104 orientation ($\alpha_x,\beta_y,\gamma_z$) in transmitter coil 102 coordinate frame (X,Y,Z) as follows:

$$\begin{bmatrix} H_x \\ H_y \\ H_z \end{bmatrix} = A * \begin{bmatrix} H_u \\ H_v \\ H_w \end{bmatrix} \quad (5)$$

where the rotation matrix, $A=A_z*A_y*A_x$
and, $$A_x = \begin{bmatrix} 1 & 0 & 0 \\ 0 & \cos\alpha_x & \sin\alpha_x \\ 0 & -\sin\alpha_x & \cos\alpha_x \end{bmatrix} \quad (6)$$

$$A_y = \begin{bmatrix} \cos\beta_y & 0 & -\sin\beta_y \\ 0 & 1 & 0 \\ \sin\beta_y & 0 & \cos\beta_y \end{bmatrix} \quad (7)$$

$$A_z = \begin{bmatrix} \cos\gamma_z & \sin\gamma_z & 0 \\ -\sin\gamma_z & \cos\gamma_z & 0 \\ 0 & 0 & 1 \end{bmatrix} \quad (8)$$

Figure 4:
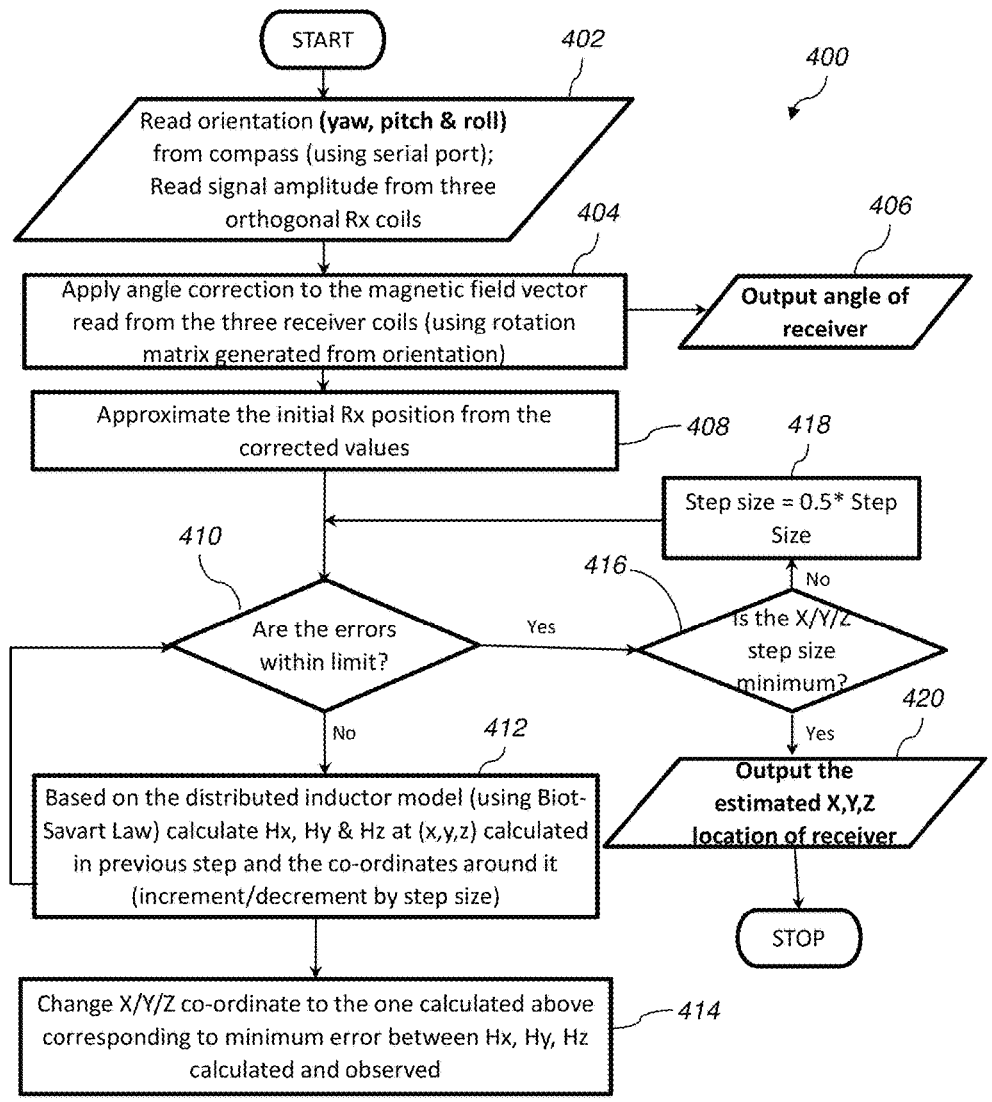
FIG. 4 is a flowchart illustrating a positioning process according to one embodiment.

Next, the estimated magnetic field vector ($H_x,H_y,H_z$) is analyzed using the transmitter field model and the receiver position is estimated. FIG. 4 illustrates a flowchart 400 for estimating the locating of the receiver 104 relative to the coil 102. First, the orientation (yaw, pitch & roll) of the receiver is read from the orientation sensor 108 and the amplitudes of the magnetic fields are read from the tri-axis magnetic sensor 106 (stage 402). At stage 404, the computing unit applies angle correction to the magnetic field vectors read from the three coils of the magnetic sensor 106 (using the rotation matrix generated from the orientation sensor 108 data) to determine and output (stage 406) the orientation of the receiver 104 relative to the coil 102.

At stage 408, the computing unit 118 approximates the initial receiver 104 position using the corrected angle/orientation values from stage 404. The approximate position may be calculated using the field equations, assuming the transmitting coil to be a point signal source, as described in Wing-Fai et al., "Magnetic Tracking System for Radiation Therapy", *IEEE Tran. Biomedical Circuits and Systems* 2010, which is herein incorporated by reference in its entirety.

$$\text{Radial Component of Mag. Field } \vec{H}_r = \frac{M\cos\varphi}{2\pi r^3} \quad (9)$$

-continued $$\text{Tangential Component of Mag. Field, } \vec{H}_t = \frac{M\sin\varphi}{2\pi r^3} \quad (10)$$

where, $r = \sqrt{x^2 + y^2 + z^2}$

These near field equations can be written in Cartesian coordinates as:

$$\text{Mag. Field along } x\text{-axis, } H_x = \frac{3Mxz}{4\pi r^5} \quad (11)$$

$$\text{Mag. Field along } y\text{-axis, } H_y = \frac{3Myz}{4\pi r^5} \quad (12)$$

$$\text{Mag. Field along } z\text{-axis, } H_z = \frac{M(2z^2 - x^2 - y^2)}{4\pi r^5} \quad (13)$$

where, $r = \sqrt{x^2 + y^2 + z^2}$

Solving the above equations leads to:

$$x = K * H_x, \quad (14)$$

where K is an empirically calculated proportionality constant (for a given transmitter and receiver), $$\frac{x}{y} = \frac{H_x}{H_y} \quad (15)$$

Therefore, $y = K * H_y$ (16)

Substituting these in above equations and recalculating, $$z = K * \frac{H_z}{4} * \left(1 \pm \sqrt{1 + 8 * \left(\frac{H_x}{H_z}\right)^2 * \left(1 + \frac{H_y}{H_x}\right)}\right) \quad (17)$$

resulting in the estimated position x,y,z of the receiver.

Moving to stage 410, the measured magnetic field data is compared to the distributed magnetic field model for the transmitting coil 102 described above to determine the error. If the error is within a predetermined limit, the process moves to stage 416, where the x/y/z step size is compared to a predetermined minimum. If the step size is at the minimum, the computing unit 118 outputs the estimated x,y,z position of the receiver 104 (stage 420). If not, the step size is reduced, e.g., by half (stage 418) and the error is again evaluated (step 410). If the result of step 410 is that the error is not within the predetermined limit, then the process moves to stage 412. At stage 412, the expected magnetic field values for a plurality of positions around the estimated position are calculated. In one example, 27 corners are evaluated (x−Δx:Δx:x+Δx, y−Δy:Δy:y+Δy, z−Δz:Δz:z+Δz), where Δ is the step size. The Euclidean distance is then found between the expected magnetic-field value and the one calculated for the 27 corners. The corner with the least distance (out of 27) is selected as the new starting position (stage 414) and the process is repeated until the solution converges and the error is within the predetermined limit. In the illustrated example, an orientation error of less than 1 degree, and a position error of less than a few millimeters are observed in most of the areas of interest. The accuracy may be further improved by optimizing the transmitting coil 102 design (size, shape, transmitting power etc.) and the receiver 104 design (amplifier sensitivity, noise performance, etc.).

Figure 5:
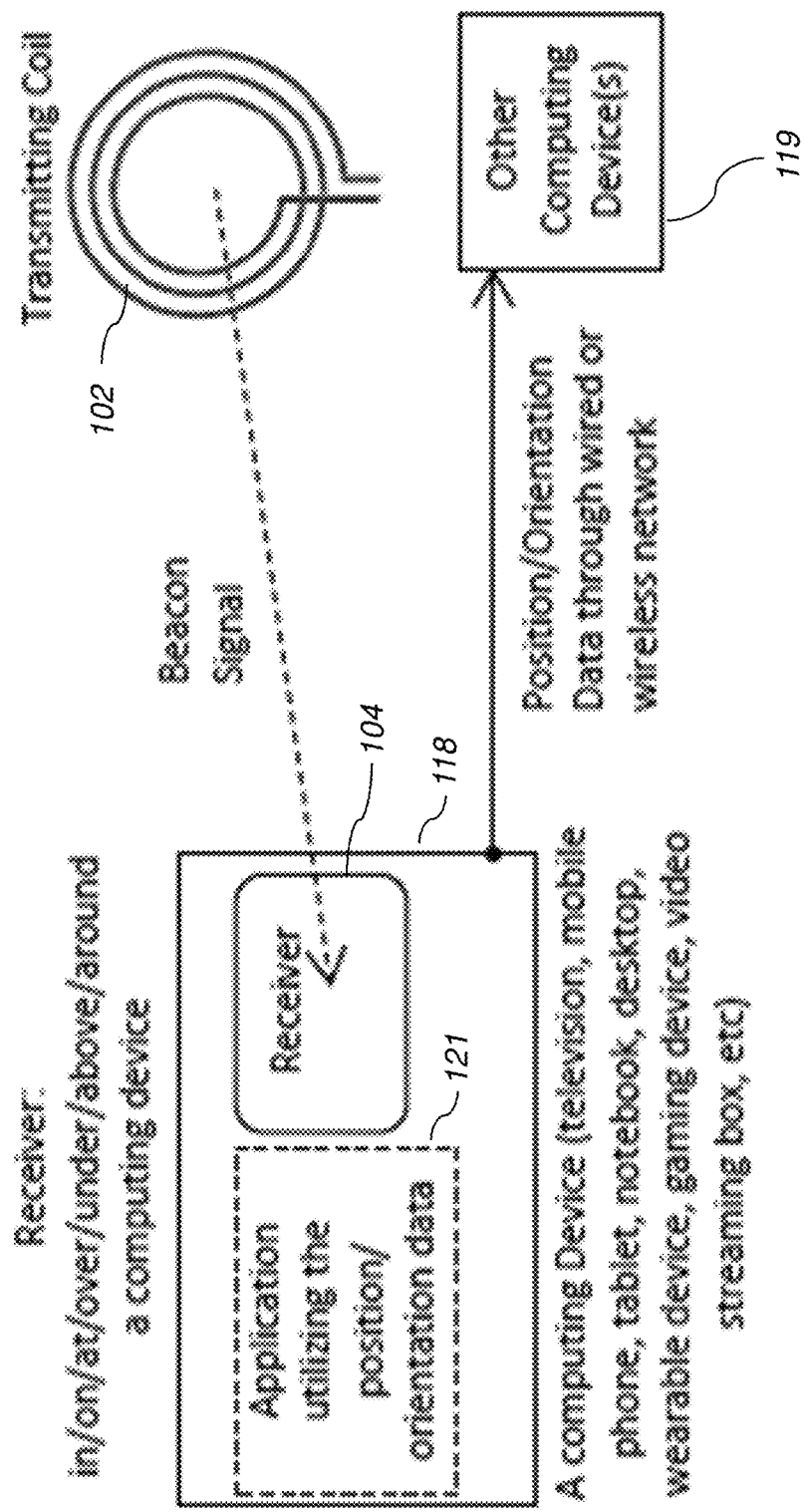
FIG. 5 is a simplified block diagram of a positioning system integrated into a computing unit where the receiver is associated with the computing unit.

The positioning system 100 may be integrated into various computing systems and networks using different configurations. FIG. 5 shows one embodiment in which the receiver 104 is associated with a computing device 118 such as a television, mobile phone, tablet computer, notebook computer, wearable computing device, a gaming device, video streaming set-top box, etc. In this embodiment, the computing device is running an application 121 utilizing the position/orientation data. The receiver 104 may be placed in/on/at/over/under/above/around the computing device 118. The receiver 104 may optionally be a part of the computing device 118. The computing device 118 can estimate its position and orientation utilizing the receiver 104. The computing device 118 may use the estimated position and orientation data for its own application, or it can share the data with other computing device(s) 119 through a wired or wireless channel.

Figure 6:
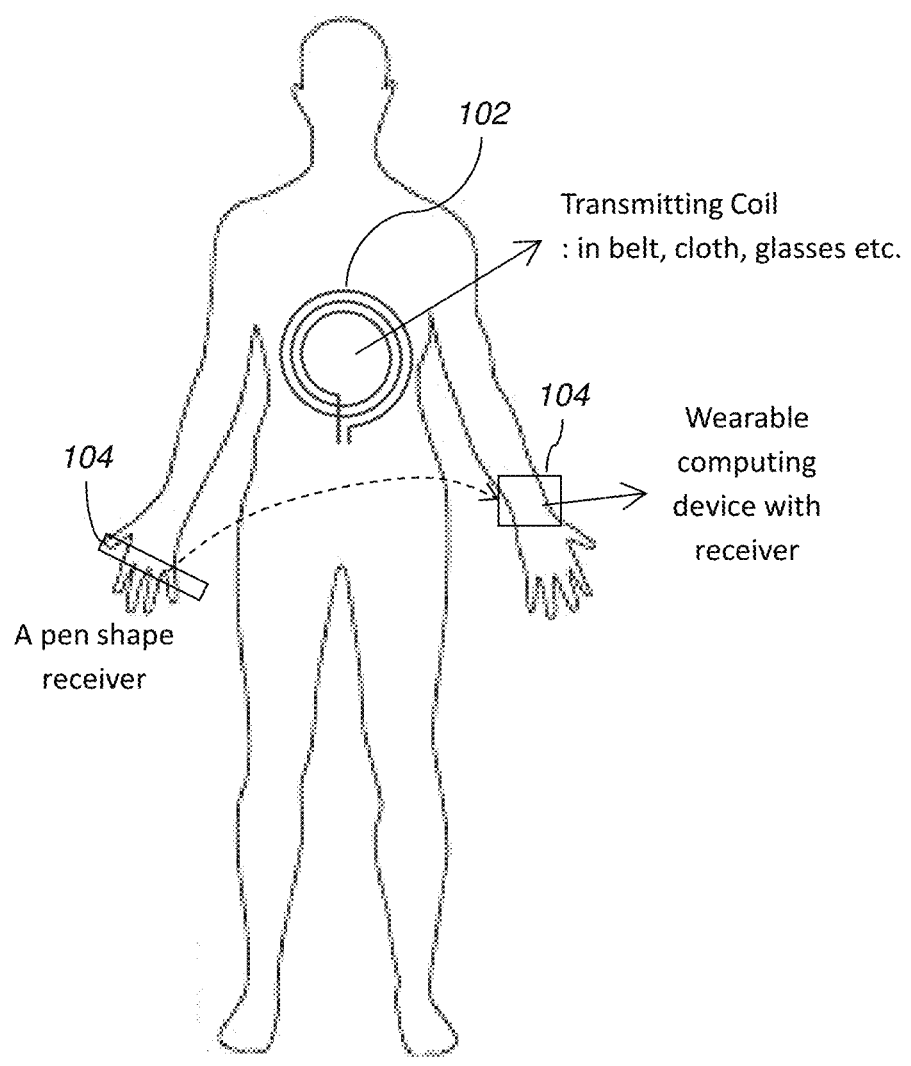
FIG. 6 is an example human body implementation of the system of FIG. 5.

FIG. 6 shows a further embodiment wherein the transmitting coil 102 is attached to a human body using a belt, cloth, glasses, etc., and a tracking receiver 104 is integrated into a wearable computing device.

Figure 7:
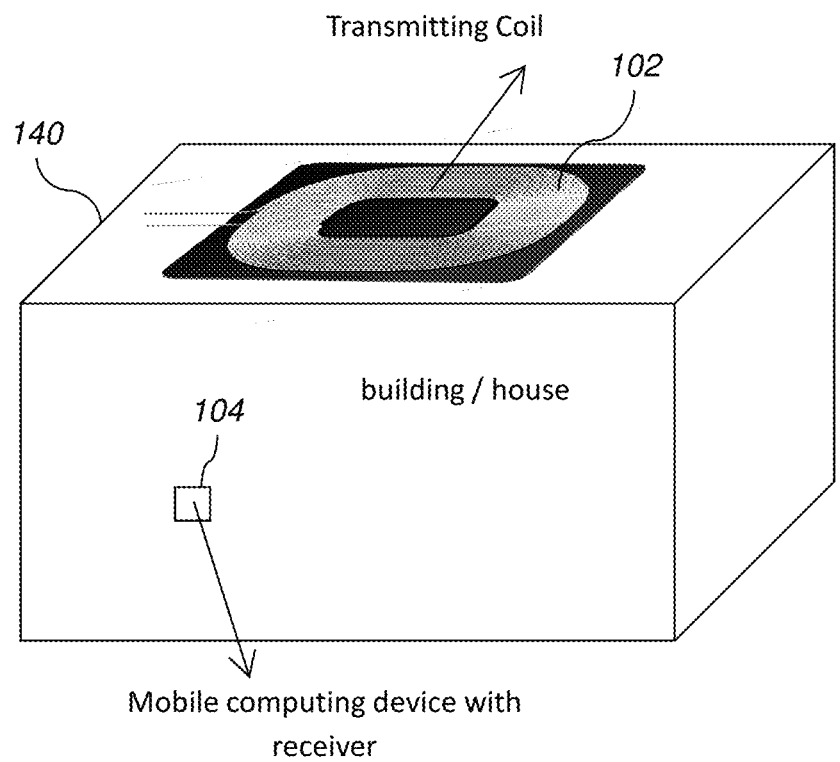
FIG. 7 is an example building area application of the system of FIG. 5.

FIG. 7 shows a further embodiment wherein the transmitting coil 102 is installed in a building 140 (in the wall, roof, ceiling, floor, etc.), and the tracking receiver 104 is integrated into a mobile computing device.

Figure 8:
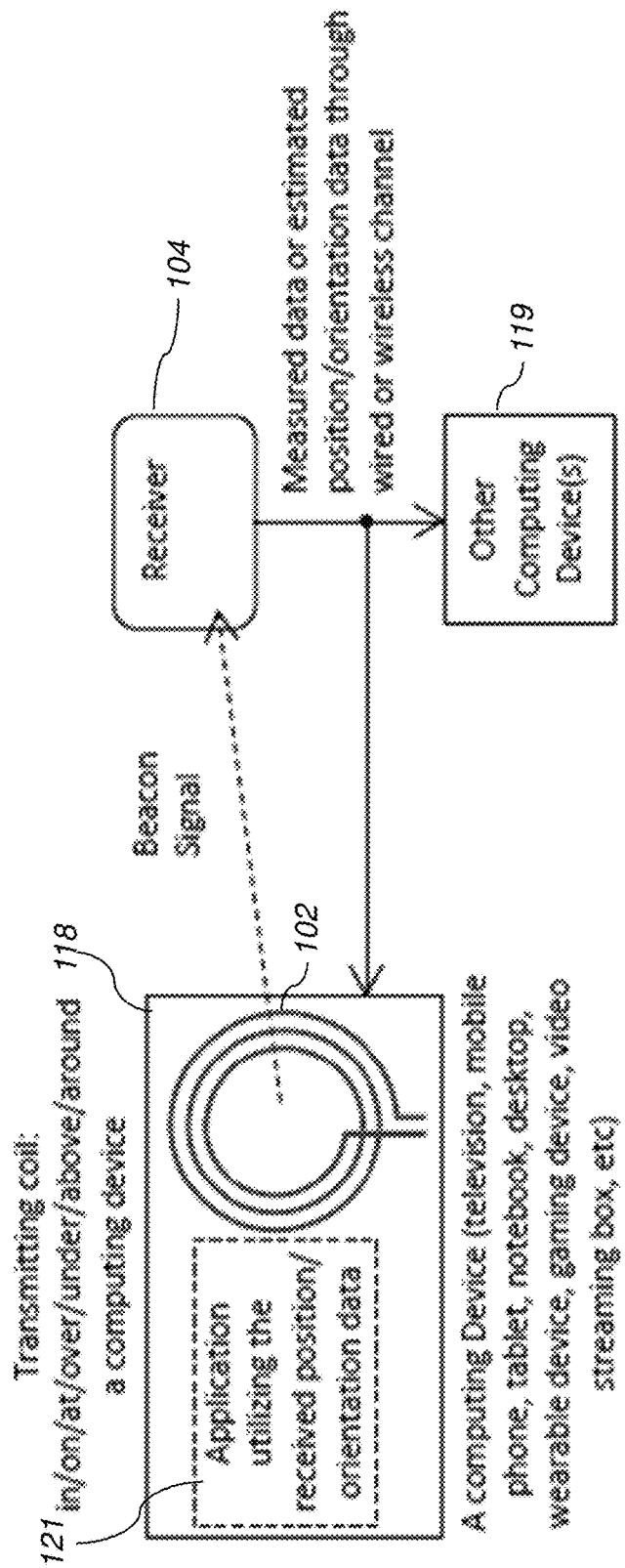
FIG. 8 is a simplified block diagram of a positioning system integrated into a computing unit where the transmitting coil is associated with the computing unit.

In further embodiments, the transmitting coil 102 may integrated with or operatively connected to the computing device 118. In this embodiment, as shown in FIG. 8, the receiver 104 (which contains the magnetic sensor 106 and orientation sensor 108) measures the magnetic field strength in its own coordinate frame, and its orientation in earth's coordinate frame. If the receiver 104 has a computing unit in it, it can estimate its position and orientation utilizing the measured data as discussed above. The receiver 104 can send the measured data or the estimated position and orientation data to the computing device 118 associated with the transmitting coil or to other computing device(s) 119 through a wired or wireless channel.

In the embodiment of FIG. 8, the receiver 104 can send the raw measurement data or post processed data required for estimating position and orientation of the receiver 104 to the computing device 118 associated with the transmitting coil 102, or to other computing devices 119. This arrangement is particularly useful when the transmitting coil 102 is not stationary (i.e. mobile). When the transmitting coil 102 is mobile, the orientation data of the transmitting coil 102 in the earth's coordinate frame needs to be fed to the receiver 104 at real-time if the receiver 104 needs to estimate its position and orientation internally. If the receiver 104 does not need to estimate its position and orientation internally, it can send the raw measurement or post-processed data to the computing device 118, and the computing device 118 can estimate the position and orientation of the receiver 104 as described above.

Figure 9:
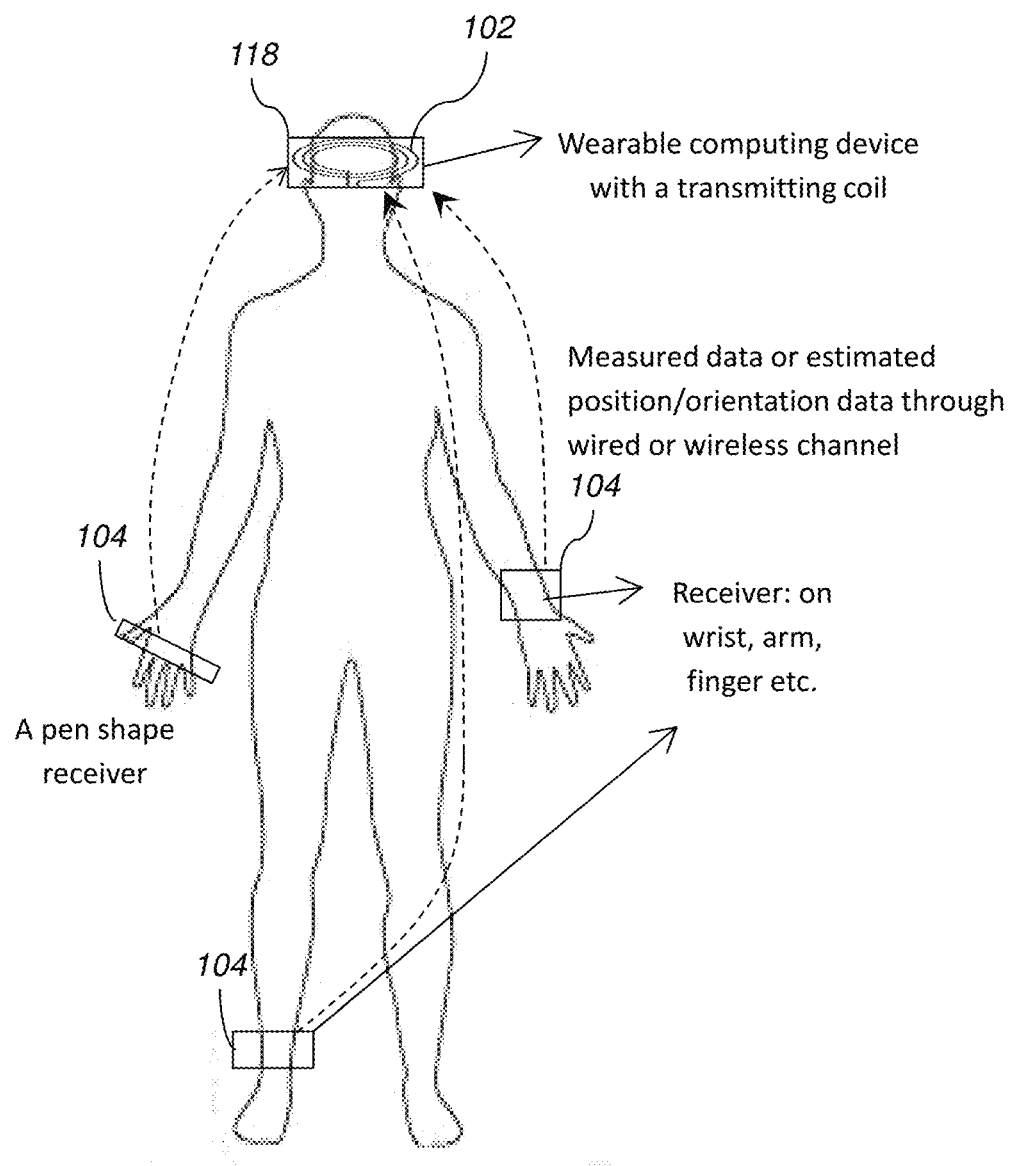
FIG. 9 is an example human body implementation of the system of FIG. 8.

FIG. 9 shows a further embodiment, similar to that of FIG. 8, where the transmitting coil 102 and computing device 118 are integrated into a mobile wearable computing device (e.g., on a user's head), and tracking receivers 104 (containing the magnetic sensor 106 and orientation sensor 108) can be placed on the wrist, arm, finger, etc. A pen shape tracking receiver that can be controlled by a hand may be used as well. In any of the disclosed embodiments, more than one receiver 104 can operate simultaneously and independently to find their positions and orientations using the same beacon signal from the transmitting coil 102.

Figure 10:
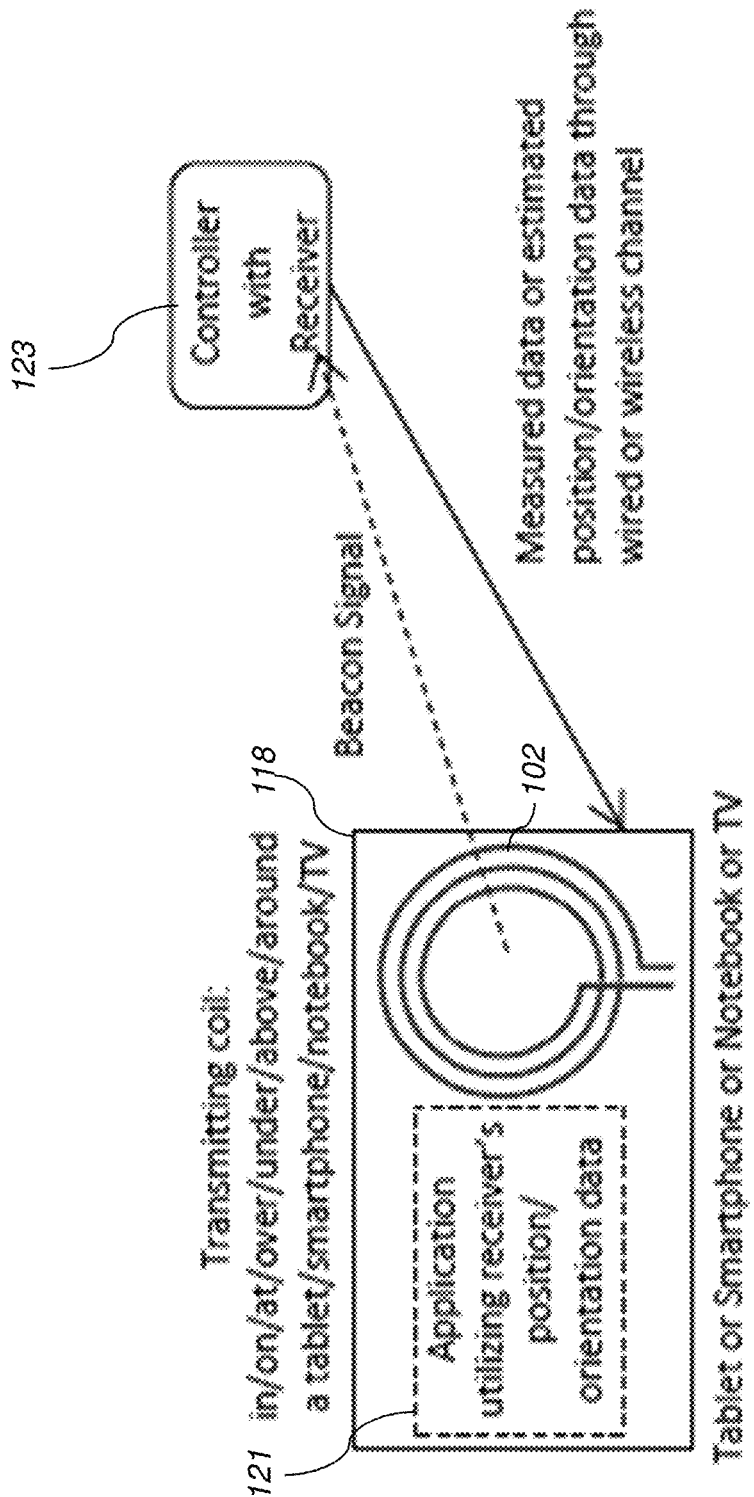
FIG. 10 is an example implementation of the system of FIG. 8 where the receiver is integrated into a controller.

FIG. 10 shows another embodiment, similar to the embodiment shown in FIG. 8, in which a computing device 118, implemented as a tablet computer, smartphone, notebook computer, or smart-TV receives measured data or estimated position/orientation data from a controller 123 (e.g. a gaming remote control or TV remote control) that has a receiver 104 in it. The controller 123 is in operative communication with the computing device 118 using a wired or wireless channel as shown, such as Bluetooth or infrared. In certain embodiments, a rectangular shape transmitting coil 102 may be formed around the computing device 118 (e.g., generally around the perimeter of a TV).

Figure 11:
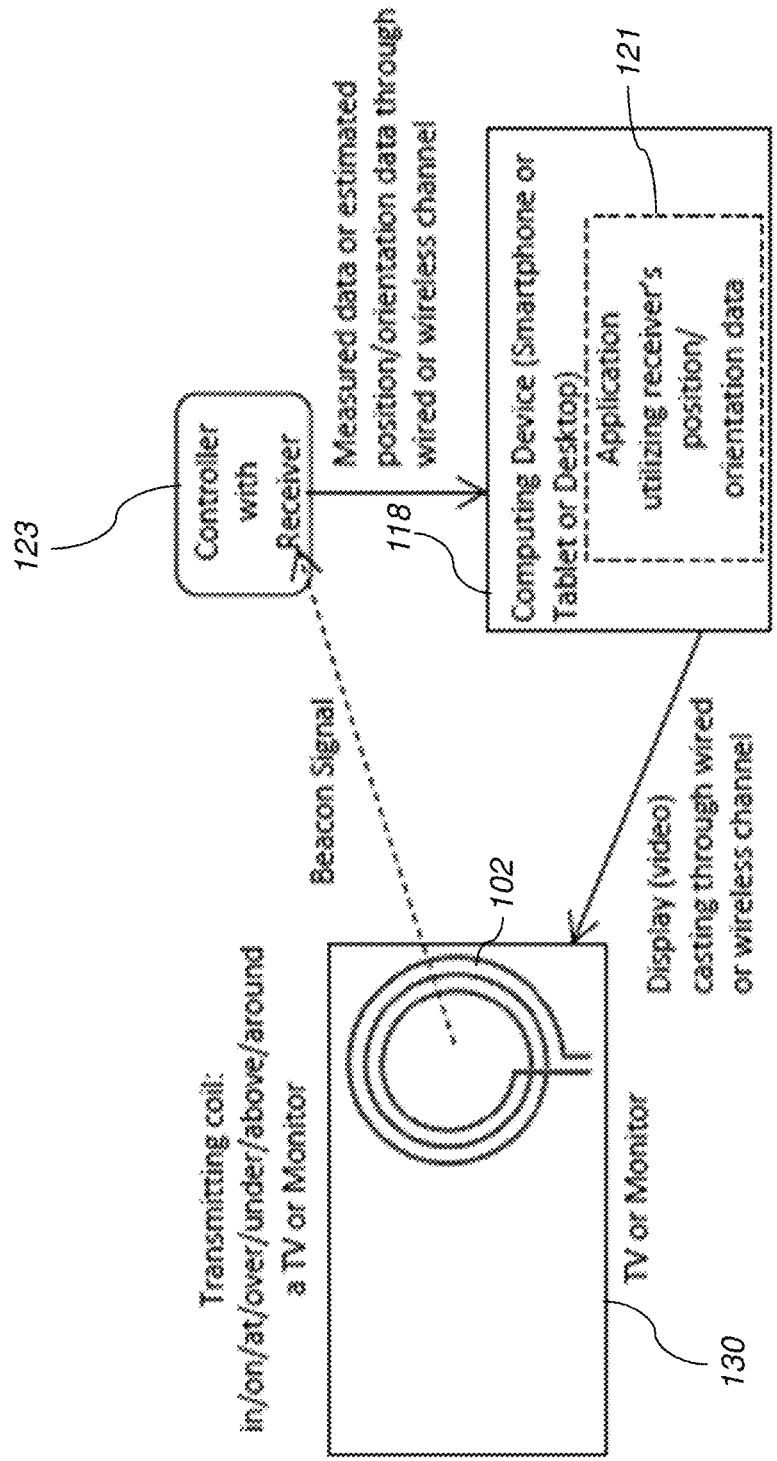
FIG. 11 is an example implementation of the system of FIG. 8 where computing unit is separate from the receiver and transmitting coil.

FIG. 11 show a further embodiment, again similar to FIG. 8, wherein the computing device 118 is implemented as a smartphone (or tablet) which receives measured data or estimated position/orientation data from the controller 123 that includes the receiver 104. The computing device 118 again runs an application 121 that utilizes the received data from the controller 123. The computing device 118 directs video (via wired or wireless channel) onto another device 130 that has video display capability (e.g., a TV or video monitor).

Figure 12:
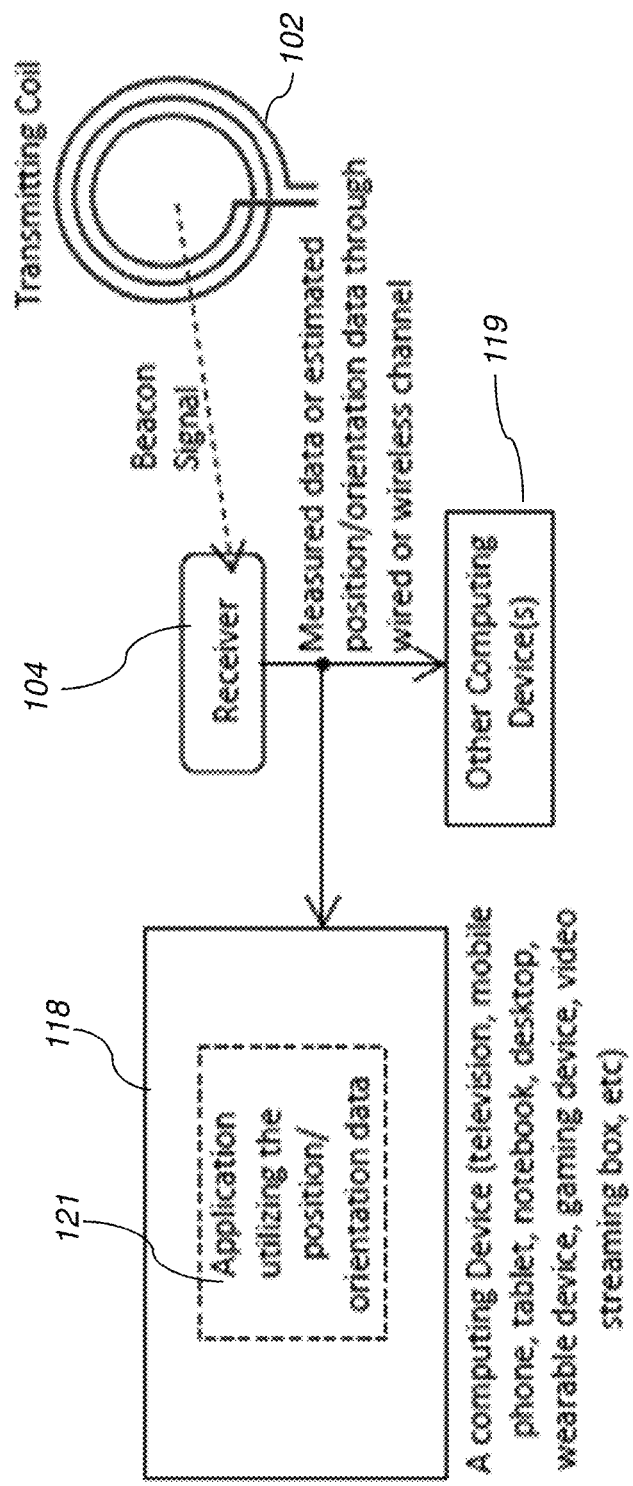
FIG. 12 is a simplified block diagram of a positioning system according to one embodiment where the transmitting coil and receiver are separate from the computing device and which includes an additional computing device.

FIG. 12 illustrates a further embodiment in which the transmitting coil 102 and receiver 104 operate as stand alone components, not as a part of other computing devices. The receiver 104 (which contains the magnetic sensor 106 and orientation sensor 108) measures the magnetic field at the position in its own coordinate frame, and its orientation in earth's coordinate frame. If the receiver 104 has its own computing unit in it, it can estimate its position and orientation in the transmitter's coordinate system using the method described above. The measured data or the estimated position and orientation data can be shared with one computing device 118 (e.g., a TV, mobile phone, tablet computer, notebook computer, desktop computer, wearable device, gaming device, video streaming box, etc.) or multiple computing devices (e.g., computing device 119) through wired or wireless channels. In this embodiment, the receiver may just send the raw measurement data or post processed data required for estimating position and orientation of the receiver 104 to a computing device (118 or 119), and the computing device can estimate the position and orientation of the receiver 104 assuming the orientation of the transmitting coil 102 in the earth's coordinate frame is known to the computing system.

Figure 13:
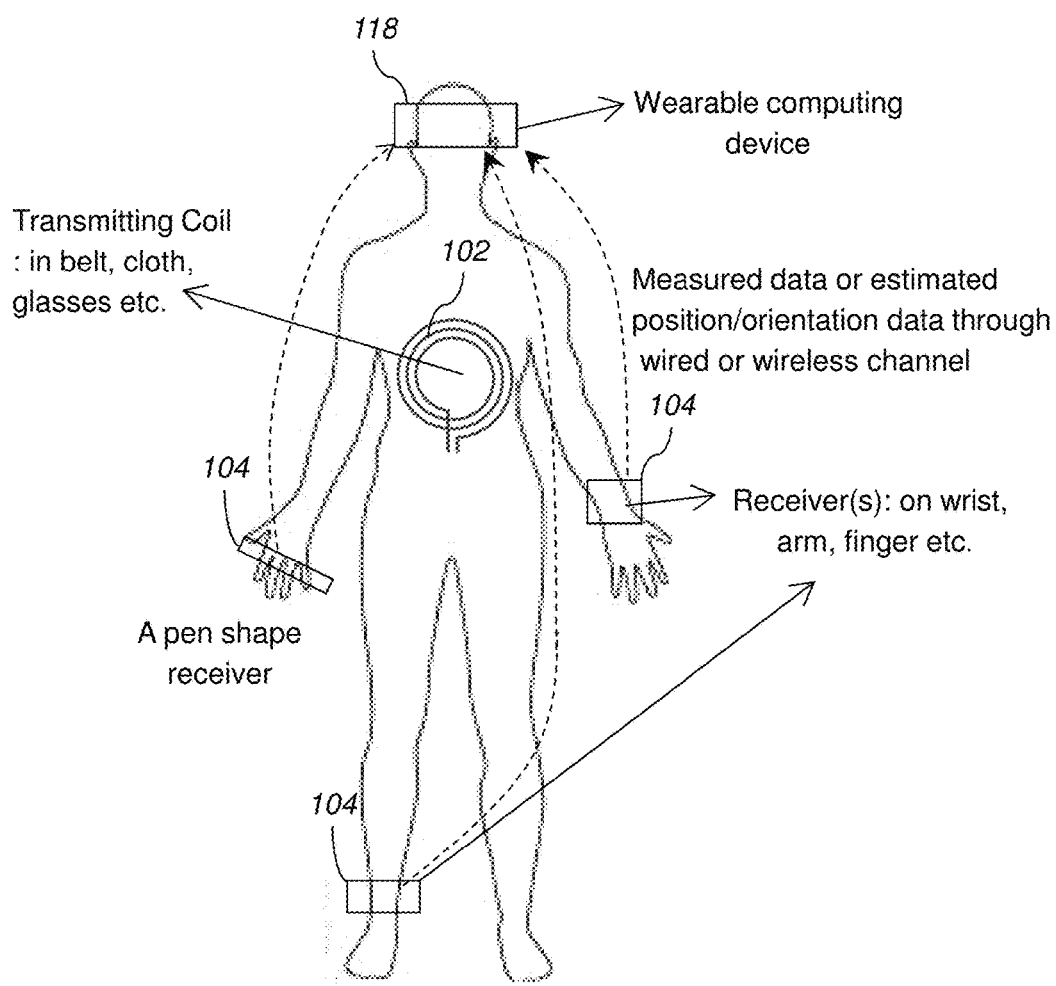
FIG. 13 is an example human body implementation of the system of FIG. 12.

FIG. 13 shows an embodiment similar to that FIG. 12, wherein the transmitting coil 102 may be attached to a human body using a belt, cloth, glasses, etc., and tracking receivers 104 may be placed on wrist, arm, finger, etc. A pen shape tracking receiver 104 that can be controlled by a hand may be used as well.

Figure 14:
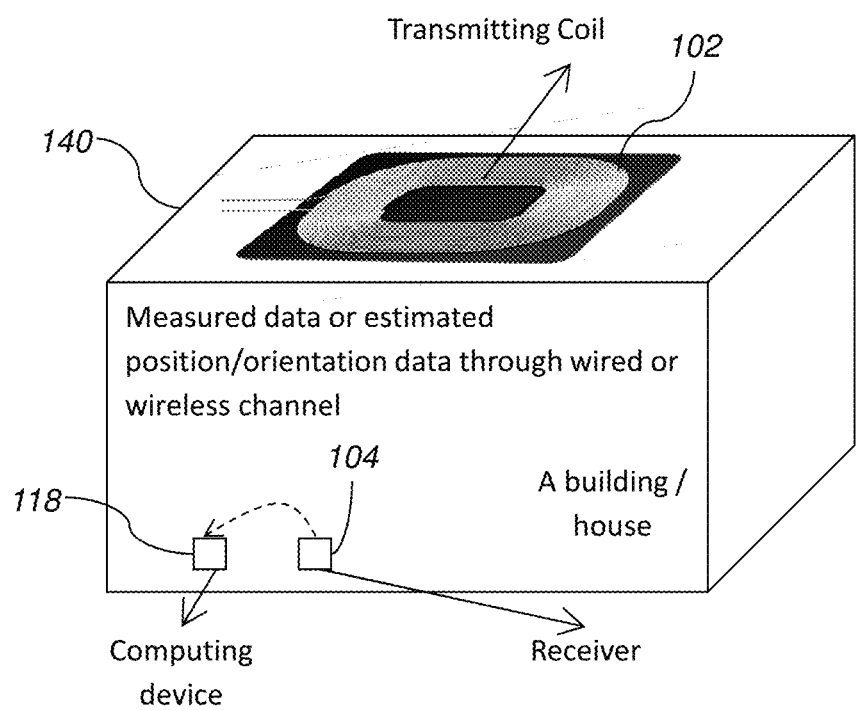
FIG. 14 is an example building area application of the system of FIG. 12.

FIG. 14 illustrates a further embodiment, similar to FIG. 12, wherein the transmitting coil 102 is fixedly installed in the building 140 (in the wall, roof, ceiling, floor, etc.), and a mobile tracking receiver 104 can use the beacon signal transmitted by the coil 102 to estimate its positions and orientation, and send the estimated position and orientation data to a computing device 118 through a wired or wireless network.

Figure 15:
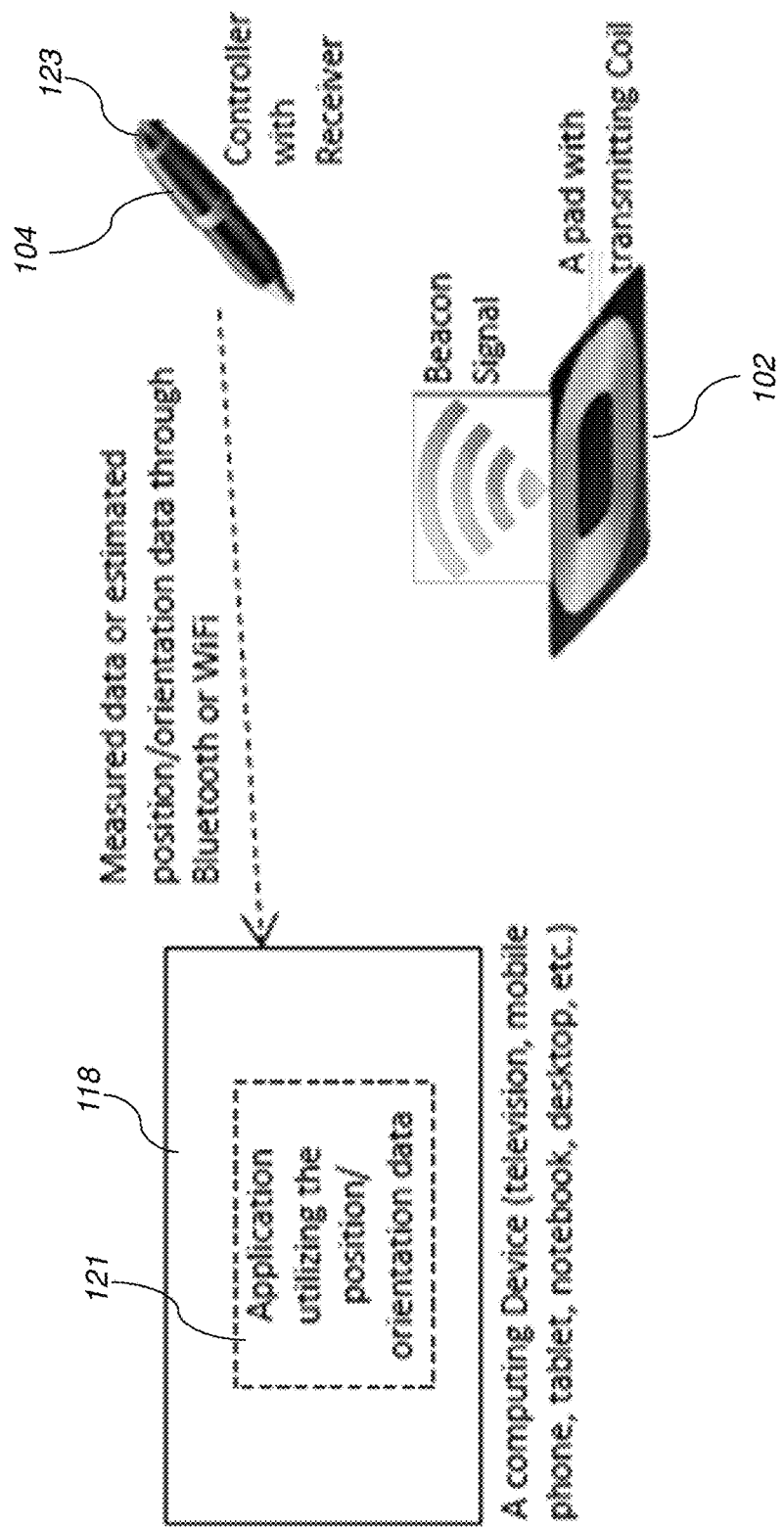
FIG. 15 is an example implementation of the system of FIG. 12 where a pen-shaped controller includes the receiver.

FIG. 15 illustrates a further embodiment, similar to FIG. 12, wherein a pen shaped controller 123 containing receiver 104 sends the measured data or estimated position/orientation data to a computing device 118 (TV, mobile phone, tablet, notebook, desktop, etc.) through a Bluetooth or Wi-Fi channel. The computing device 118 runs an application 121 that utilizes the received data from the controller 123.

Figure 16:
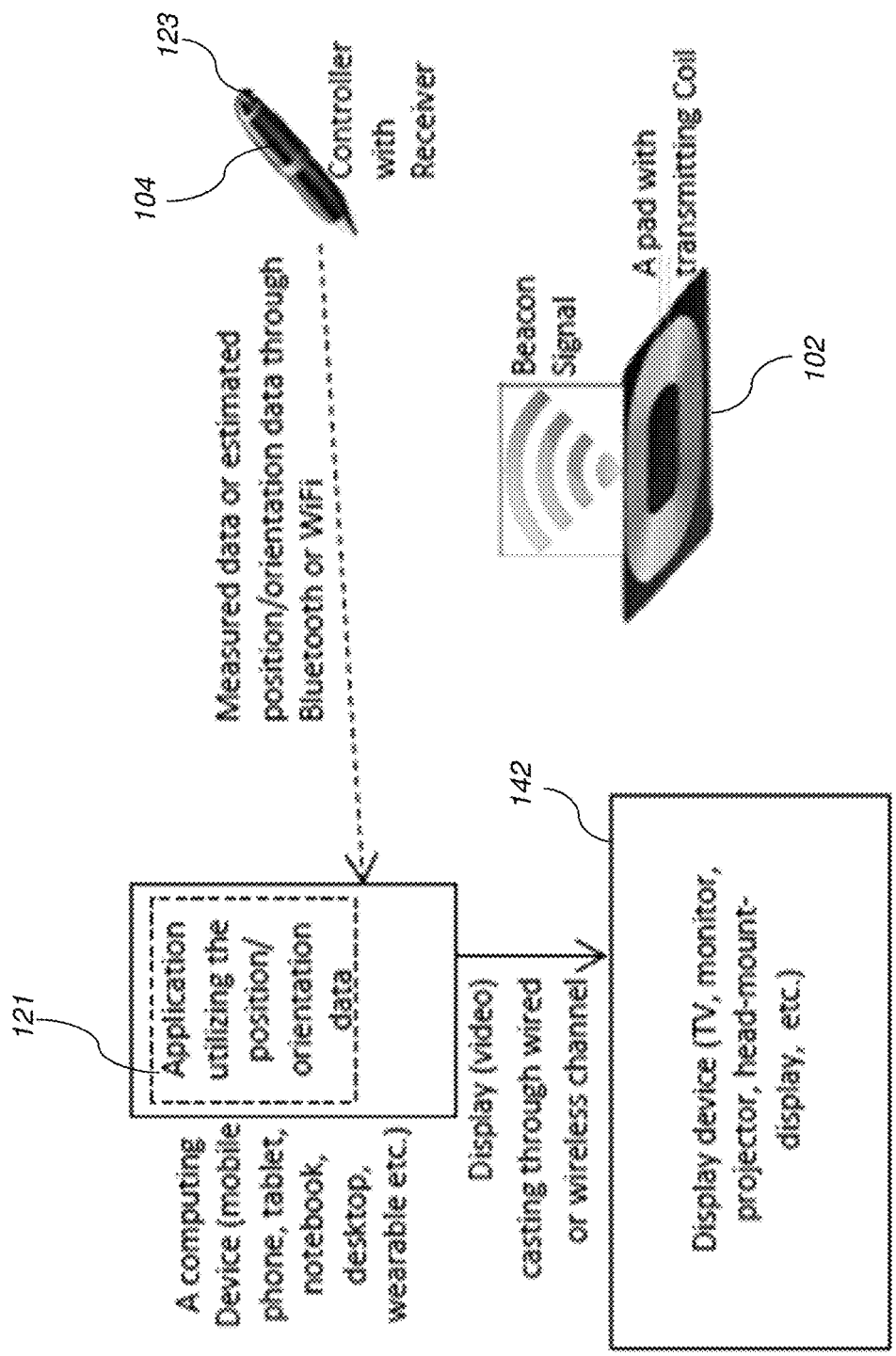
FIG. 16 is an example implementation of the system of FIG. 12, where a pen-shaped controller includes the receiver and the computing unit is separate from an electronic display device.

FIG. 16 illustrates a further embodiment, similar to FIG. 12, wherein a pen shaped controller 123 containing receiver 104 sends the measured data or estimated position/orientation data to a computing device 118 (mobile phone, tablet, notebook, desktop, etc.) through a Bluetooth or Wi-Fi channel. The computing device 118 runs an application 121 that utilizes the received data from the controller 123. The computing device 118 cast video and/or sound (via wired or wireless channel) to a video display device 142 (e.g., a TV, monitor, projector, etc.).

Figure 17:
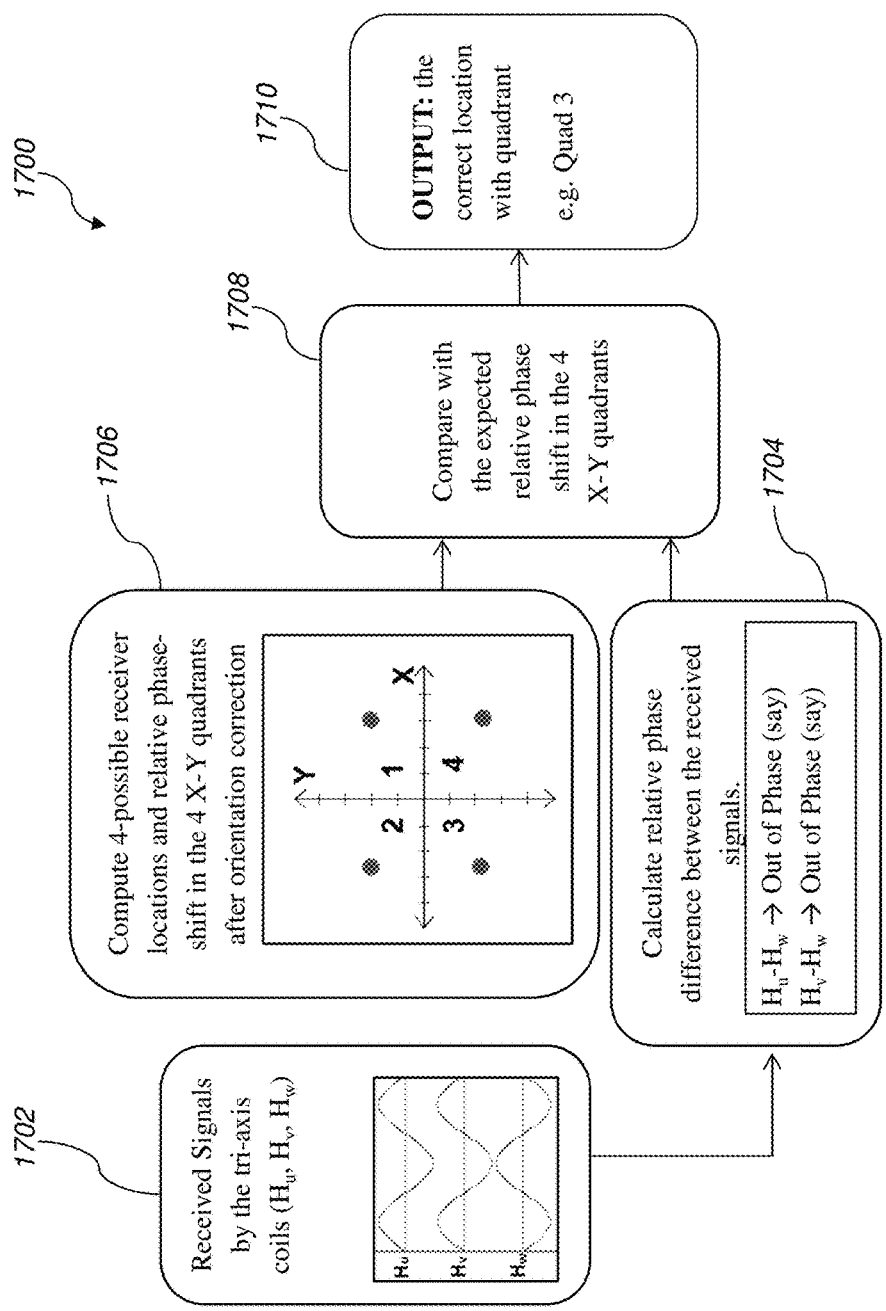
FIG. 17 illustrates a quadrant finding process according to one embodiment.

FIG. 17 illustrates a process 1700 for phase based quadrant finding. In other words, the process 1700 allows the system 100 to determine which of four possible quadrants in the XY plane of the XYZ coordinate system the receiver is located in. Assuming that the transmitter coil 102 lies in the XY-plane of the transmitter co-ordinate system (X, Y, and Z co-ordinate system), the relative phases between the signals received by the coils in the tri-axis sensor 106 can provide its quadrant. For most practical applications, the receiver 104 is located in +Z direction (on one side of transmitter 102), hence the quadrant detection method for such a setup is explained here. This method may also be expanded to an eight quadrant system to locate a device located in any direction of the transmitter 102. The process 1700 begins at stage 1702 where the magnetic field signals are sensed by the magnetic sensor 106, and their relative phases are stored (stage 1704). In the illustrated example, the implementation block 1702 shows that signals $H_u$-$H_w$ are out of phase, and signals $H_v$-$H_w$ is also out of phase. At stage 1706, the four possible locations (one in each xy-quadrant) are computed by converting the signals from the U,V,W co-ordinate system of the earth to the X,Y,Z co-ordinate system of the transmitter. Once the four possible locations are known, the expected relative phase between the signals is calculated (also in stage 1706) at the possible receiver locations and compared (stage 1708) with the observed relative phases. This correct relative phase match gives the correct receiver quadrant and thus the correct receiver location (output at stage 1710). In the example shown in FIG. 17, the $H_u$-$H_w$ and $H_v$-$H_w$ pairs show out of phase relation only in quadrant 3, hence the receiver actually lies in quadrant 3.

As an alternative to the method for initially approximating the receiver location described above with respect to step 408 of FIG. 4, the initial receiver 104 position approximation may be accomplished by using the available distributed transmitter-field model. The magnetic field vector at various locations (at certain coarse space interval) around the transmitter 102 is pre-computed and stored in a table. This look-up table can then be used to map the receiver 104 location in the transmitter co-ordinate system directly. Alternatively, this table may be used to curve-fit and generate polynomial equations (similar to step 408 in FIG. 4) which are used to compute the approximate receiver 104 location. The co-efficients of the polynomials are specific to a certain transmitter 102 and cannot be generalized for another transmitter. Once the approximate receiver position co-ordinates have been found by using any of the methods described above (or a combination of these methods), the distributed model of transmitter 102 is used to precisely compute the receiver 104 location. This approach helps in reducing the computation time and increasing accuracy.

Figure 18:
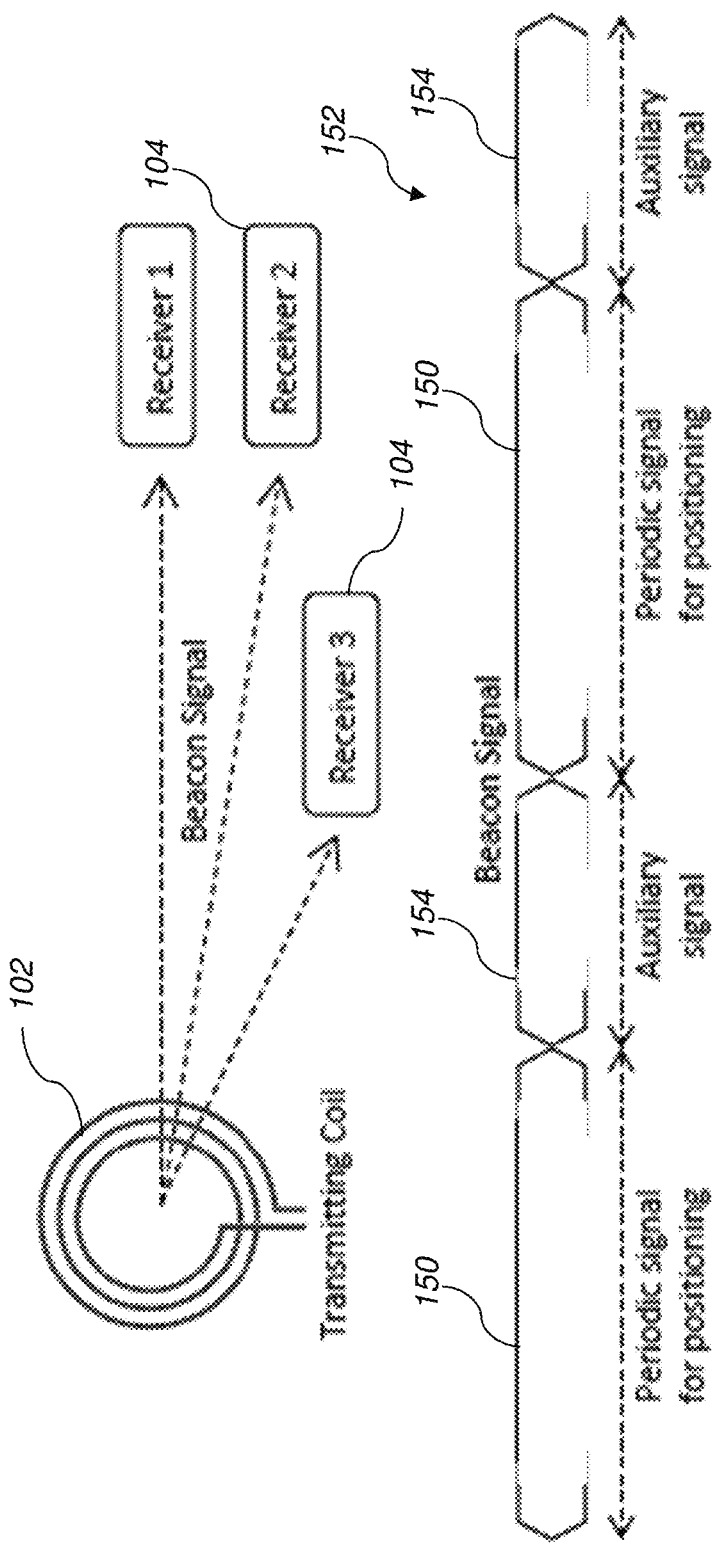
FIG. 18 illustrates an example beacon signal structure utilizing time division according to one embodiment.
Figure 19:
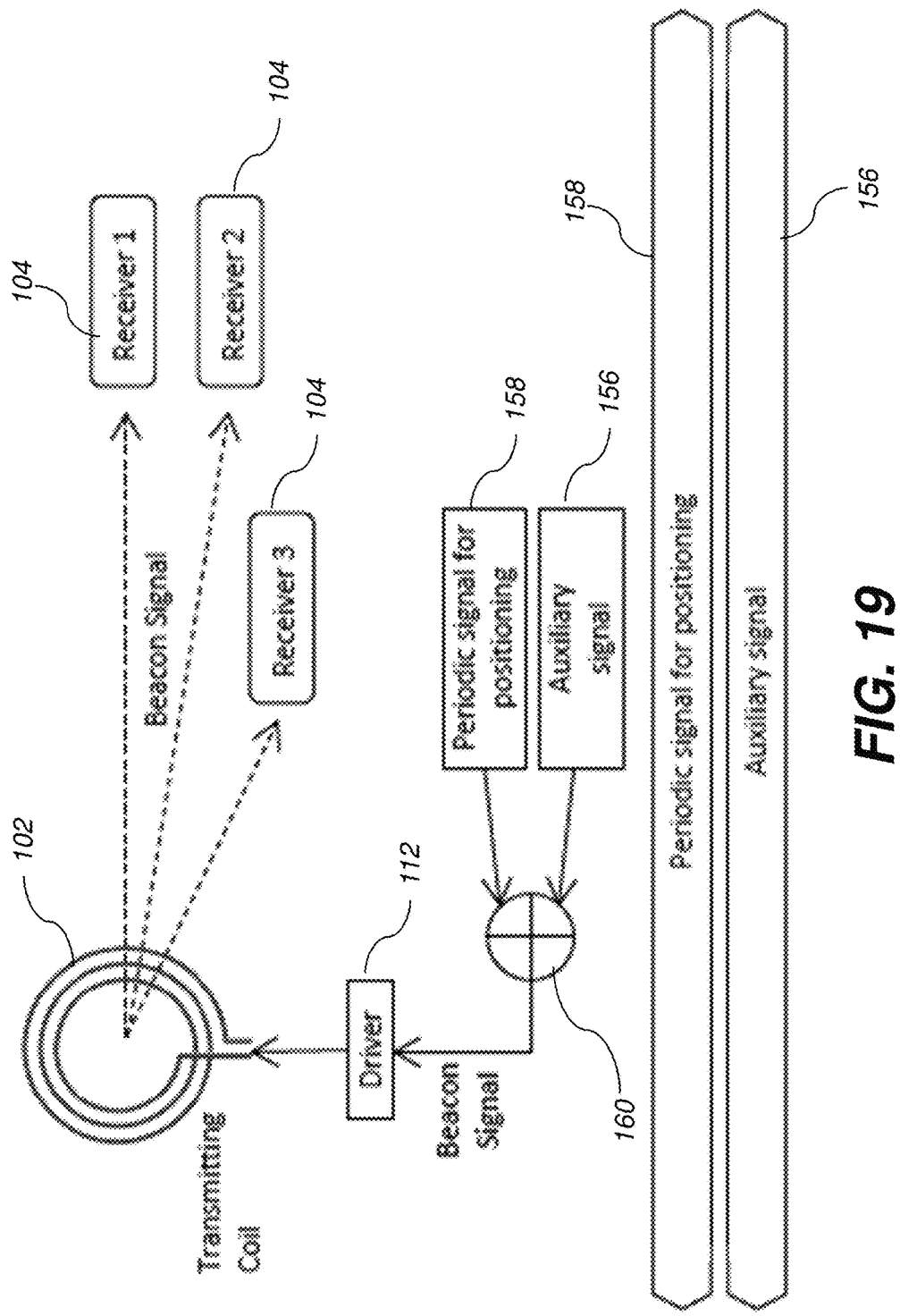
FIG. 19 illustrates an example beacon signal structure utilizing modulation according to one embodiment.

In certain embodiments, the beacon signal transmitted by the transmitting coil 102 includes a periodic signal that can be used by a receiver 104 to estimate its position and orientation. In further embodiments, the beacon signal may also include additional signals that provide additional information to the receivers 104. The additional information that can be transmitted by the transmitting coil 102 may include transmitting coil identification number, transmitting coil orientation, transmitting coil position, transmitting signal frequency, transmitting coil size and shape, etc. The additional signals including additional information can be transmitted in a time-division manner as shown in FIG. 18. As shown, a first portion 150 of the beacon signal 152 is a positioning signal, and a second portion 154 is an auxiliary signal containing the additional information. Alternatively, as shown in FIG. 19, the auxiliary signal (156) can be transmitted with the periodic signal (158) by a modulator 160 using phase modulation or frequency modulation.

Figure 20:
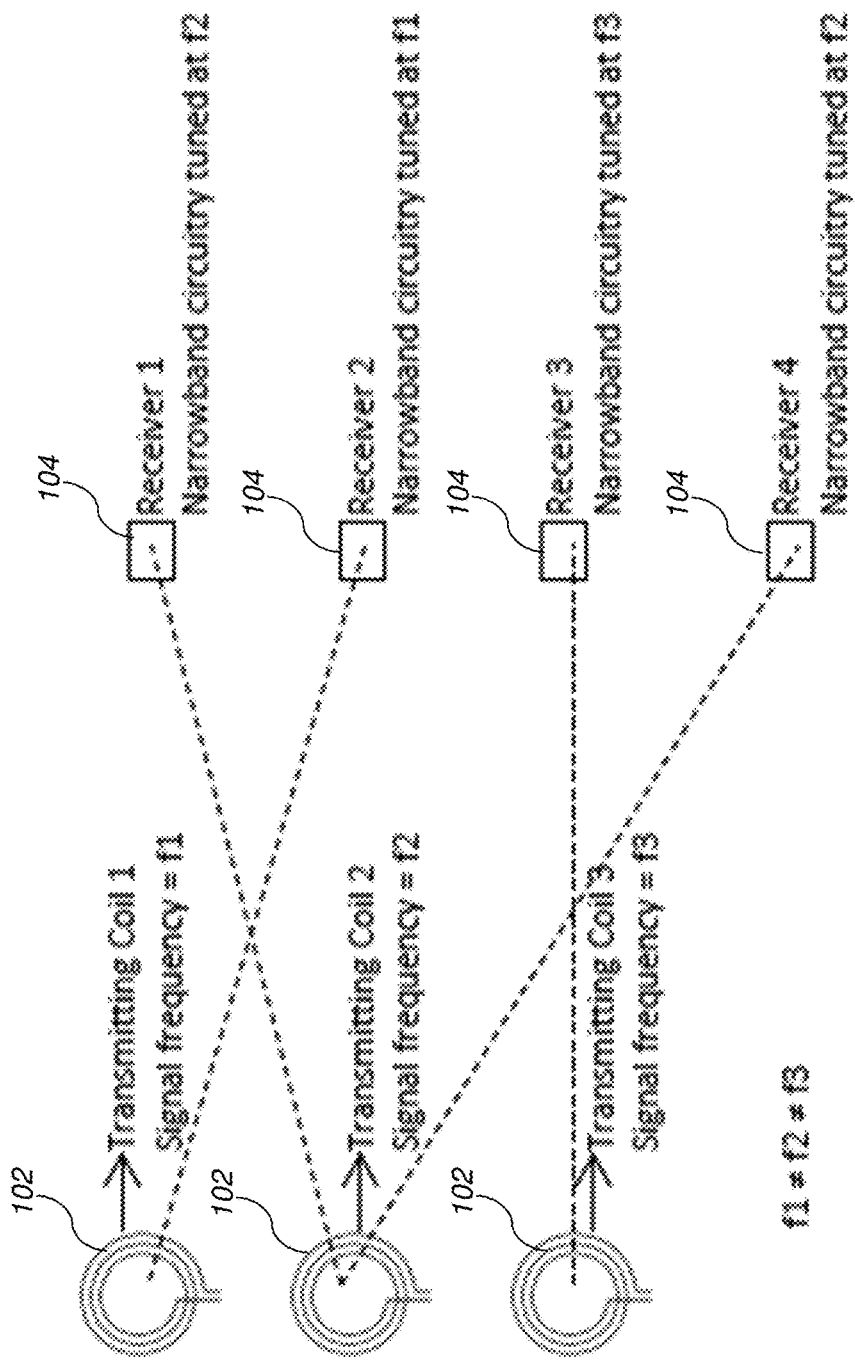
FIG. 20 illustrates a collision avoidance structure according to one embodiment.

In cases where multiple systems 100 are operating in the same vicinity (i.e., multiple transmitter/receiver pairs), a particular receiver 104 may pick up transmitted signals from multiple transmitters, thereby disabling proper estimation of the receiver position. In certain embodiments different transmitter coils 102 transmit at differing frequencies. Then, the individual receivers 104 are tuned using narrow band circuitry or filtering to the specific frequency of its corresponding target transmitter 102, as illustrated in FIG. 20. In FIG. 20, Receiver 2 uses a narrowband circuitry tuned at fl, and hence it picks up the beacon signal transmitted by Transmitting Coil 1. Consequently, Receiver 2 estimates its position and orientation in the coordinate frame of Transmitting Coil 1.

Figure 21A:
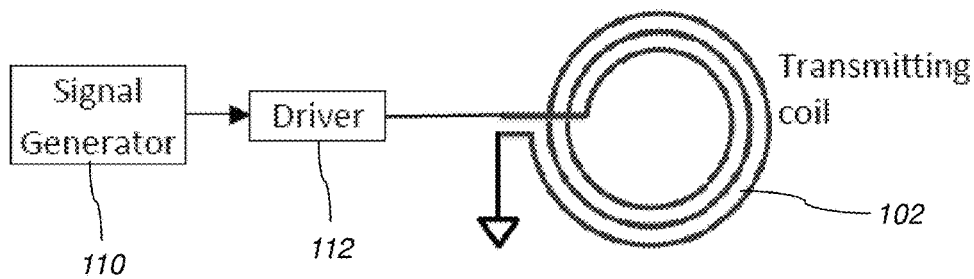
FIG. 21A illustrates a transmitting coil design according to one embodiment.
Figure 21B:
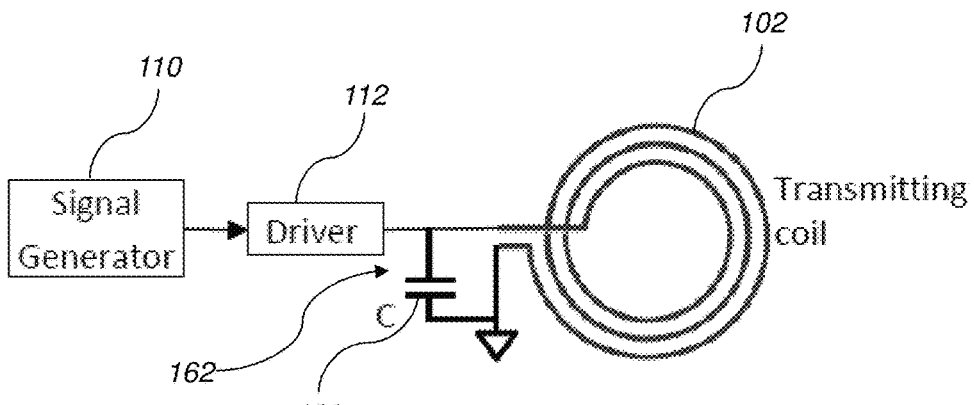
FIG. 21B illustrates a transmitting coil design incorporating an LC resonator according to one embodiment.
Figure 21C:
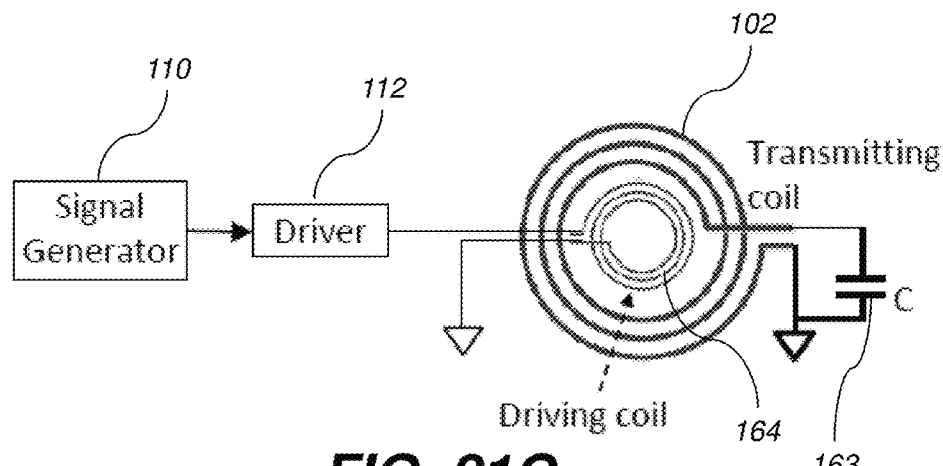
FIG. 21C illustrates a transmitting coil design incorporating a driving coil according to one embodiment.

In certain embodiments, the antenna coil 102 may be optimized to improve quality. One implementation is using a simple coil as shown in FIG. 21(A). The quality of the transmitted signal can be improved using an LC resonator 162 configuration as shown in FIG. 21(B). The quality of the transmitting signal can be further improved by using a driving coil 164 that drives the transmitting coil 102, as shown in FIG. 21(C). The capacitor 163 shown in FIG. 21(b) and FIG. 21(c) may be a voltage controlled or mechanically controlled variable capacitor. Using the variable capacitor, the resonant frequency of the LC tank 162 can be adjusted to match with the transmitting signal frequency. The examples shown in FIG. 21 use a single-ended driver. Instead of using a single-ended driver, a differential driver may optionally be used.

Any of the computing units 118 or 119, the receiver 104, the magnetic sensor 106, the orientation sensor 108, the signal generator 110, the driver 112, and the controller 123 may include one or more computer processors, memory, and data storage units for analyzing data and performing other analyses described herein, and related components. The processors can each include one or more microprocessors, microcontrollers, field-programmable gate arrays (FPGAs), application-specific integrated circuits (ASICs), programmable logic devices (PLDs), programmable logic arrays (PLAs), programmable array logic devices (PALs), or digital signal processors (DSPs). The data storage unit can include or be communicatively connected with one or more processor-accessible memories configured to store information. The memories can be, e.g., within a chassis or as parts of a distributed system. The phrase "processor-accessible memory" is intended to include any data storage device to or from which processor 186 can transfer data, whether volatile or nonvolatile; removable or fixed; electronic, magnetic, optical, chemical, mechanical, or otherwise. Exemplary processor-accessible memories include but are not limited to: registers, floppy disks, hard disks, tapes, bar codes, Compact Discs, DVDs, read-only memories (ROM), erasable programmable read-only memories (EPROM, EEPROM, or Flash), and random-access memories (RAMs). One of the processor-accessible memories in the data storage system 140 can be a tangible non-transitory computer-readable storage medium, i.e., a non-transitory device or article of manufacture that participates in storing instructions that can be provided to processor for execution.

Various aspects described herein may be embodied as systems or methods. Accordingly, various aspects herein may take the form of an entirely hardware aspect, an entirely software aspect (including firmware, resident software, micro-code, etc.), or an aspect combining software and hardware aspects These aspects can all generally be referred to herein as a "service," "circuit," "circuitry," "module," or "system."

Furthermore, various aspects herein may be embodied as computer program products including computer readable program code stored on a tangible non-transitory computer readable medium. Such a medium can be manufactured as is conventional for such articles, e.g., by pressing a CD-ROM. The program code includes computer program instructions that can be loaded into the processor (and possibly also other processors), to cause functions, acts, or operational steps of various aspects herein to be performed by the processor. Computer program code for carrying out operations for various aspects described herein may be written in any combination of one or more programming language(s).

The invention is inclusive of combinations of the aspects described herein. References to "a particular aspect" or "embodiment" and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. A positioning system, comprising:
   a) a transmitting coil having a known orientation with respect to the earth's coordinate system and configured to transmit a periodic signal during a positioning event;
   b) at least one receiver including a sensing unit for measuring the magnetic field vector produced by the transmitting coil and the orientation of the receiver with respect to the earth's coordinate system, the sensing unit including a tri-axis magnetic sensor for measuring the magnetic field and an orientation sensor for measuring the orientation, the magnetic sensor including three field sensors oriented orthogonally to each other; and
   c) at least one computing unit configured to estimate a position and orientation of the receiver with respect to the transmitter's coordinate system using the measured magnetic field vector, the measured orientation with respect to the earth's coordinate system, and the known orientation of the transmitting coil with respect to the earth's coordinate system.

2. The system according to claim 1, wherein the transmitting coil is integrated into a mobile electronic device, and both transmitting coil and positioning sensor move simultaneously, and wherein the orientation of the transmitting coil in the earth's coordinate system is provided to the computing unit in the receiver at real time.

3. The system of claim 1, comprising a plurality of receivers which operate simultaneously and independently.

4. The system according to claim 1, wherein the computing unit is integrated in the receiver.

5. The system according to claim 1, wherein the computing unit is located remotely from the receiver, the receiver transmits the measured magnetic field vector and the orientation with respect to the earth's coordinate system to the computing unit through a wired or wireless channel.

6. The system according to claim 1, wherein the magnetic sensor includes three planar coils oriented orthogonally to each other.

7. The system according to claim 1, wherein the receiver comprises a plurality of tri-axis magnetic sensors for measuring the magnetic field of the transmitting coil.

8. The system according to claim 1, wherein the transmitting coil is integrated into a computing unit, the position data of the receiver is transmitted to the computing unit.

9. The system according to claim 8, wherein the computing unit comprises at least one of a television, mobile phone, tablet computer, notebook computer, desktop computer, wearable device and a video gaming device.

10. The system according to claim 1, wherein the receiver is integrated into the computing unit, allowing the position of the computing unit with respect to the transmitting coil to be determined.

11. The system according to claim 1, wherein the receiver is configured as a stand-alone unit, the receiver sends the position and orientation data to the computing unit through a wired or wireless channel.

12. The system according to claim 1, wherein the transmitting coil is configured to transmit a beacon signal, the beacon signal including a periodic signal portion for determining the receiver position and an auxiliary signal portion.

13. The system according to claim 12, wherein the auxiliary signal portion includes at least one of coil identification information, coil orientation, transmitting signal frequency, transmitting coil size, and transmitting coil shape.

14. The system according to claim 1, further comprising:
a plurality of transmitting coils, each of said transmitting coils configured to transmit at a different frequency; and
a plurality of receivers, each of said receivers configured to receive a signal from one of said transmitting coils.

15. The system of claim 1, wherein the computing unit is configured to determine the quadrant of the receiver position relative to the coil using phase based quadrant finding.

16. The system according to claim 1, wherein the computing unit is configured to perform an initial estimate of the receiver position and orientation of the receiver, and then evaluate a plurality of positions around the initial estimated position.

17. The system according to claim 16, wherein the computing unit is further configured to evaluate errors between measured field values for the plurality of positions and predicted field values.

18. The system according to claim 17, the computing unit further configured to select a second estimated position from the plurality of positions, the second estimated position having the smallest field error compared to the remaining plurality of positions.

* * * * *